United States Patent
Inoue et al.

(10) Patent No.: US 7,816,693 B2
(45) Date of Patent: Oct. 19, 2010

(54) THIN FILM TRANSISTOR IN WHICH AN INTERLAYER INSULATING FILM COMPRISES TWO DISTINCT LAYERS OF INSULATING MATERIAL

(75) Inventors: Kazunori Inoue, Tokyo (JP); Harumi Murakami, Kumamoto (JP); Toshio Araki, Kumamoto (JP); Nobuaki Ishiga, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 307 days.

(21) Appl. No.: 11/526,768

(22) Filed: Sep. 26, 2006

(65) Prior Publication Data

US 2007/0069211 A1    Mar. 29, 2007

(30) Foreign Application Priority Data

Sep. 27, 2005    (JP)    ............................. 2005-279398

(51) Int. Cl.
*H01L 29/18*    (2006.01)
*H01L 27/15*    (2006.01)
*G02F 1/1333*    (2006.01)
*G02F 1/1335*    (2006.01)
*G02F 1/1339*    (2006.01)

(52) U.S. Cl. .................... 257/88; 257/E27.121; 349/58; 349/69; 349/190

(58) Field of Classification Search ............... 257/93, 257/E27.121, 88; 349/58, 69, 190
See application file for complete search history.

(56) References Cited

U.S. PATENT DOCUMENTS

| | | | |
|---|---|---|---|
| 5,953,094 A | 9/1999 | Matsuoka et al. | |
| 6,323,924 B1 | 11/2001 | Matsuoka et al. | |
| 6,466,294 B1 * | 10/2002 | Yamagishi et al. | 349/155 |
| 6,972,824 B2 | 12/2005 | Masutani et al. | |
| 6,982,776 B2 | 1/2006 | Nagano et al. | |
| 2001/0019372 A1 * | 9/2001 | Ootsu et al. | 349/38 |
| 2002/0018176 A1 * | 2/2002 | Kobayashi et al. | 349/200 |
| 2002/0132385 A1 * | 9/2002 | Dojo et al. | 438/30 |
| 2004/0005741 A1 * | 1/2004 | Takenaka | 438/149 |
| 2004/0070718 A1 * | 4/2004 | Saigo et al. | 349/141 |

(Continued)

FOREIGN PATENT DOCUMENTS

CN    1553269 A    12/2004

(Continued)

*Primary Examiner*—Phat X Cao
*Assistant Examiner*—Diana C Garrity
(74) *Attorney, Agent, or Firm*—Oblon, Spivak, McClelland, Maier & Neustadt, L.L.P.

(57) ABSTRACT

According to an aspect of the present invention, there is provided a display apparatus including a TFT array substrate on which TFTs are formed in an array, a counter substrate disposed so as to face the TFT array substrate, and a sealing pattern for adhering the TFT array substrate and the counter substrate to each other, wherein the counter substrate comprises a counter electrode, and the TFT array substrate comprises a first conductive layer, a first insulating film formed on the first conductive layer, a second conductive layer disposed so as to intersect the first conductive layer via the first insulating film, a second insulating film formed on the second conductive layer and having at least two layers, and common electrode wiring provided below the sealing pattern and electrically connected to the counter electrode by the sealing pattern, and the sealing pattern overlaps the second conductive layer via the second insulating film.

11 Claims, 34 Drawing Sheets

U.S. PATENT DOCUMENTS

| | | | |
|---|---|---|---|
| 2004/0201787 A1* | 10/2004 | Sekiguchi et al. | 349/16 |
| 2005/0082527 A1* | 4/2005 | Nakamura et al. | 257/57 |
| 2006/0215102 A1* | 9/2006 | Otose et al. | 349/151 |

FOREIGN PATENT DOCUMENTS

| | | |
|---|---|---|
| JP | 63-131569 | 6/1988 |
| JP | 8-254712 | 10/1996 |
| JP | 9-325358 | 12/1997 |
| JP | 10-62810 | 3/1998 |
| JP | 10-282515 | 10/1998 |
| JP | 2000-29066 | 1/2000 |
| JP | 2001-249345 | 9/2001 |
| JP | 2003-307741 | 10/2003 |
| JP | 2003-307748 | 10/2003 |
| JP | 2006-126255 | 5/2006 |

* cited by examiner

THIN FILM TRANSISTOR IN WHICH AN INTERLAYER INSULATING FILM COMPRISES TWO DISTINCT LAYERS OF INSULATING MATERIAL

BACKGROUND OF THE INVENTION

1. Field of the Invention

The present invention relates to a display apparatus and a manufacturing method thereof, in which defects caused by a short circuit between conductive layers sandwiching an insulating film can be prevented, enabling an improvement in yield.

2. Description of Related Art

As disclosed in Japanese Unexamined Patent Application Publication No. 8-254712, in active matrix type liquid crystal display apparatuses of recent years, a lateral electric field method, in which the direction for applying an electric field to the liquid crystal is set parallel to the substrate, has been used principally as a method for obtaining an ultra-wide viewing angle. It is known that by employing this method, contrast variation and gradation inversion, occurring when the viewing angle direction is varied, can be substantially eliminated.

In Japanese Unexamined Patent Application Publication No. 8-254712, a pair of counter electrodes are disposed at a remove from each other on either side of lower layer source wiring. Thus, when a voltage is applied to the source wiring, an electric field is generated by the voltage, and as a result, the orientation of liquid crystal provided between a thin film transistor (to be abbreviated to TFT hereafter) array substrate and a color filter substrate is varied. To prevent this, the width of the pair of counter electrodes must be increased, thereby limiting light transmission, and as a result, the aperture ratio of a display area decreases.

To solve this problem, a device structure employing a lateral electric field method has been disclosed in Japanese Unexamined Patent Application Publication No. 2003-307748, for example. In Japanese Unexamined Patent Application Publication No. 2003-307748, a counter electrode covers the source wiring such that the two overlap. According to this constitution, the electric field generated by the source wiring is blocked by the counter electrode, and therefore the electric field does not affect the liquid crystal, enabling a reduction in variation of the liquid crystal orientation. As a result, the width of the counter electrode which limits light transmission can be reduced, enabling an increase in the aperture ratio.

This technique of overlapping the source wiring and the electrode thereabove to increase the aperture ratio is applied similarly in a conventional method, where the electric field is applied to the liquid crystal in a perpendicular direction to the substrate, and is disclosed in Japanese Unexamined Patent Application Publication No. 9-325358, for example. In this method, a counter electrode opposing a pixel electrode is formed on a color filter substrate which is adhered to a TFT array substrate on which the pixel electrode is formed.

Japanese Unexamined Patent Application Publication No. 2001-249345 discloses a liquid crystal display apparatus in which a TFT array substrate and a color filter substrate are adhered to each other via a conductive sealing pattern serving as an adhesive layer. Common electrode wiring formed on the TFT array substrate and a common electrode formed on the color filter substrate are electrically connected via the conductive sealing pattern. The common electrode serves as a counter electrode opposing a pixel electrode.

However, in the case of Japanese Unexamined Patent Application Publication No. 2003-307748, the upper layer counter electrode covers the lower layer source wiring via an interlayer insulating film such that the two overlap. Hence, when pin holes, fractures, and so on occur in the overlapping region of the interlayer insulating film, an electrical short circuit occurs between the upper layer counter electrode and lower layer source wiring, leading to a display defect which causes problems such as a reduction in yield and a decrease in reliability.

Further, in the case of Japanese Unexamined Patent Application Publication No. 9-325358, the upper layer pixel electrode and the lower layer source wiring overlap partially via an interlayer insulating film, and hence similar problems to those described above occur.

In the case of Japanese Unexamined Patent Application Publication No. 2001-249345, the conductive sealing pattern for adhering the TFT array substrate to the color filter substrate is applied so as to surround an display area of the liquid crystal display apparatus formed on the TFT array substrate. Hence, when pin holes, fractures, and so on occur in a region of the interlayer insulating film where the conductive sealing pattern and the lower layer source wiring overlap, an electrical short-circuit occurs between the lower layer source wiring and the common electrode formed on the counter substrate via the conductive sealing pattern, leading to a display defect which causes problems such as a reduction in yield and a decrease in reliability.

Defects in the interlayer insulating film such as pin holes and fractures may be caused by air bubbles in resist used to form a resist pattern during patterning, air bubbles contained in a liquid developer used during resist development, or foreign matter infiltrating the interlayer insulating film during film deposition, for example. Therefore, it is difficult in practice to eliminate these defects completely.

An object of the present invention is to obtain a display apparatus and a manufacturing method thereof with which inter-electrode short circuits caused by pin holes and other defects in an interlayer insulating film can be prevented, enabling improvements in yield and reliability.

SUMMARY OF THE INVENTION

According to an aspect of the present invention, there is provided a display apparatus including a TFT array substrate on which TFTs are formed in an array, a counter substrate disposed so as to face the TFT array substrate, and a sealing pattern for adhering the TFT array substrate and the counter substrate to each other, wherein the counter substrate comprises a counter electrode, and the TFT array substrate comprises a first conductive layer, a first insulating film formed on the first conductive layer, a second conductive layer disposed so as to intersect the first conductive layer via the first insulating film, a second insulating film formed on the second conductive layer and having at least two layers, and common electrode wiring provided below the sealing pattern and electrically connected to the counter electrode by the sealing pattern, and the sealing pattern overlaps the second conductive layer via the second insulating film. This structure allows the display apparatus to prevent inter-electrode short circuits caused by pin holes and other defects in an interlayer insulating film, and to improve in yield and reliability.

According to another aspect of the present invention, there is provided the TFT array substrate further comprises a third conductive layer provided on the second insulating film, and the second insulating film between the second conductive layer and the third conductive layer is formed from at least two layers. This structure allows the display apparatus to prevent inter-electrode short circuits caused by pin holes and other defects in an interlayer insulating film.

According to another aspect of the present invention, there is provided the TFT array substrate in which a contact hole formed in the second insulating film, an opening portion of an upper layer of the at least two-layer second insulating film is formed to be larger than an opening portion of a lower layer such that a sectional form of the second insulating film is stepped or tapered. This structure allows the display apparatus to prevent disconnection defects in the contact hole stepped portions of the sealing pattern or the third conductive layer.

According to another aspect of the present invention, there is provided the TFT array substrate in which a layer thickness of the upper layer of the second insulating film formed from at least two layers is thinner than a layer thickness of the lower layer. This structure allows the display apparatus to improve in reliability.

According to another aspect of the present invention, there is provided the manufacturing method for a display apparatus, comprising the steps of manufacturing a TFT array substrate by forming a first conductive layer on a substrate, forming common electrode wiring on the substrate, forming a first insulating film on the first conductive layer, forming a second conductive layer on the first insulating film, and forming a second insulating film having at least two layers on the second conductive layer, disposing a counter substrate having a counter electrode so as to face the TFT array substrate, adhering the TFT array substrate and the counter substrate to each other using a sealing pattern which is disposed so as to overlap the second conductive layer via the second insulating film; and electrically connecting the counter electrode and the common electrode wiring via the sealing pattern in a region where the sealing pattern overlaps the common electrode wiring. This method allows the display apparatus to prevent inter-electrode short circuits caused by pinholes and other defects in an interlayer insulating film, and to improve in yield and reliability.

According to another aspect of the present invention, there is provided the manufacturing method for a display apparatus, further comprising the steps of forming a third conductive layer on the second insulating film, and forming the second insulating film between the second conductive layer and the third conductive layer from at least two layers. This method allows the display apparatus to prevent inter-electrode short circuits caused by pin holes and other defects in an interlayer insulating film, and to improve in yield and reliability.

According to another aspect of the present invention, there is provided the manufacturing method for a display apparatus, further comprising the steps of forming a contact hole in the second insulating film by forming an opening portion in an upper layer of the second insulating film, which is formed from at least two layers, to be larger than an opening portion formed in a lower layer, and electrically connecting the common electrode wiring and the counter electrode by providing the sealing pattern on the contact hole. This method allows the display apparatus to prevent disconnection defects in the contact hole stepped portions of the sealing pattern or the third conductive layer.

According to another aspect of the present invention, there is provided the manufacturing method for a display apparatus, further comprising the steps of forming a lower layer insulating film of the second insulating film, which is formed from at least two layers, and forming an upper layer insulating film at a film thickness which is thinner than the film thickness of the lower layer insulating film. This method allows the display apparatus to improve in yield and reliability.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

First Embodiment

Figure 1:
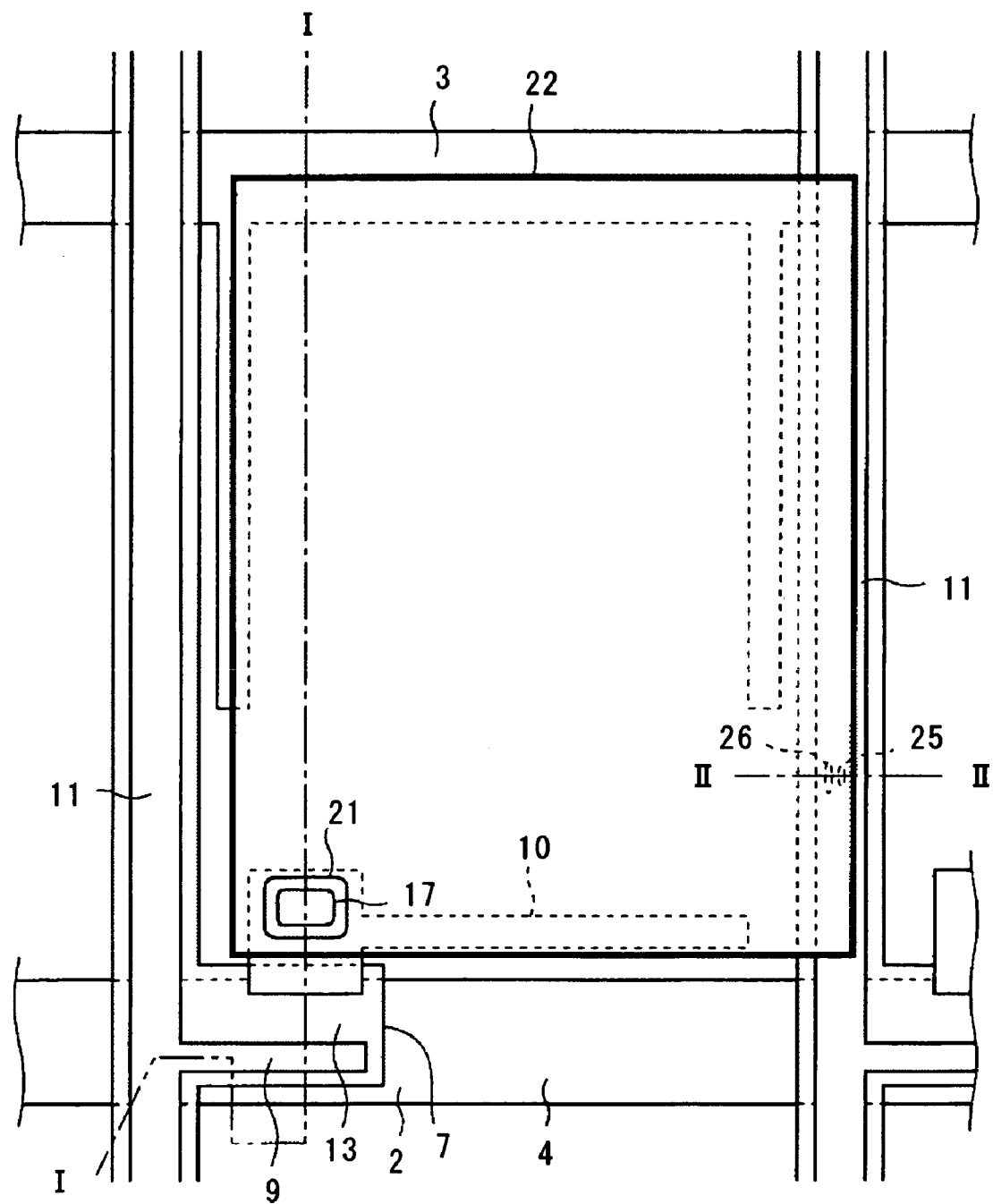
FIG. 1 is a plan view of a TFT array substrate for a liquid crystal display apparatus according to a first embodiment of the present invention.
Figure 2:
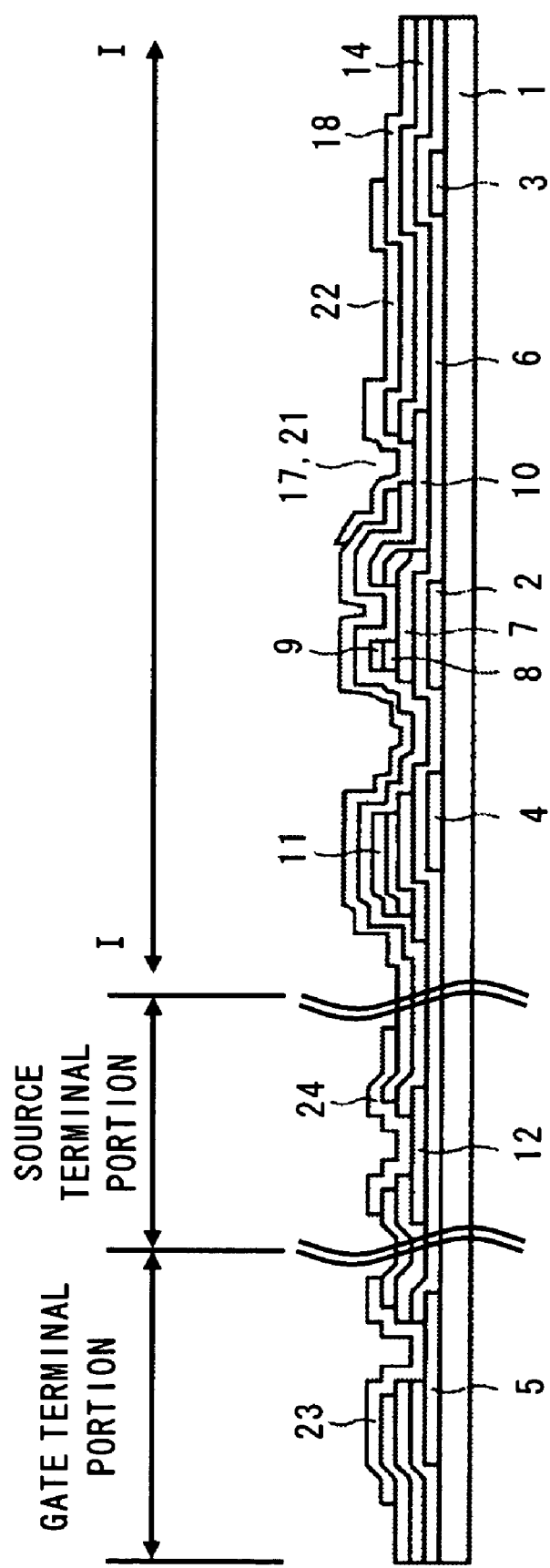
FIG. 2 is a sectional view of the TFT array substrate for a liquid crystal display apparatus according to the first embodiment of the present invention.

FIG. 1 is a plan view of a TFT array substrate for a liquid crystal display apparatus according to a first embodiment of the present invention. FIG. 2 is a sectional view of the TFT array substrate for a liquid crystal display apparatus shown in FIG. 1. Note that the sectional view in FIG. 2 shows the sectional structure of a gate terminal portion and a source terminal portion in addition to a cross-section of I-I in FIG. 1.

This TFT array substrate for a liquid crystal display apparatus is provided with a lowermost first conductive layer (a gate electrode 2, a storage capacitor common electrode 3, a gate wiring 4, and a gate terminal 5) formed by depositing at least one type of conductive thin film on a transparent insulating substrate 1 such as a glass substrate. Further, a gate insulating film 6 serving as a first insulating film is provided so as to cover all or a part of the lowermost first conductive layer. A second conductive layer (a source electrode 9, a drain electrode 10, a source wiring 11, and a source terminal 12) constituted by at least one type of conductive thin film is provided on the gate insulating film 6.

Further, two-layer insulating films 14, 18 serving as a second insulating film are provided on the second conductive layer. A contact hole 15 (see FIG. 10) is provided in the first interlayer insulating film 14 of the two-layer interlayer insulating film and the gate insulating film 6. Contact holes 16, 17 (see FIGS. 10 and 12) are also provided in the first interlayer insulating film 14. Meanwhile, contact holes 19, 20, 21 (see FIG. 12) are provided in the second interlayer insulating film 18. The contact hole 19 is provided in a position corresponding to the contact hole 15. The contact hole 20 is provided in a position corresponding to the contact hole 16. The contact hole 21 is provided in a position corresponding to the contact hole 17.

A third conductive layer (a pixel electrode 22, a gate terminal pad 23, and a source terminal pad 24) is provided on the interlayer insulating film 18 so as to cover at least a part of the interlayer insulating films 14, 18 and the contact holes 15, 16, 17. The third conductive layer is formed from at least one type of conductive thin film.

Figure 10:
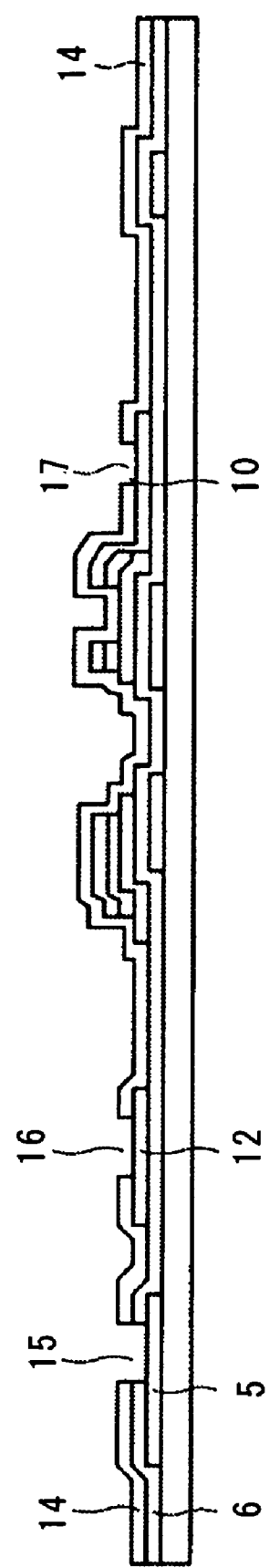
FIG. 10 is a sectional view showing a process for manufacturing the TFT array substrate for a liquid crystal display apparatus according to the first embodiment of the present invention.
Figure 12:
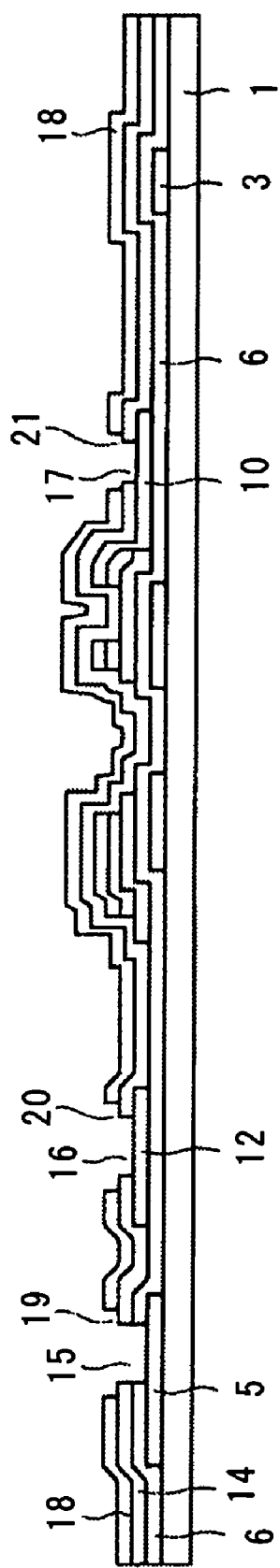
FIG. 12 is a sectional view showing a process for manufacturing the TFT array substrate for a liquid crystal display apparatus according to the first embodiment of the present invention.
Figure 14:
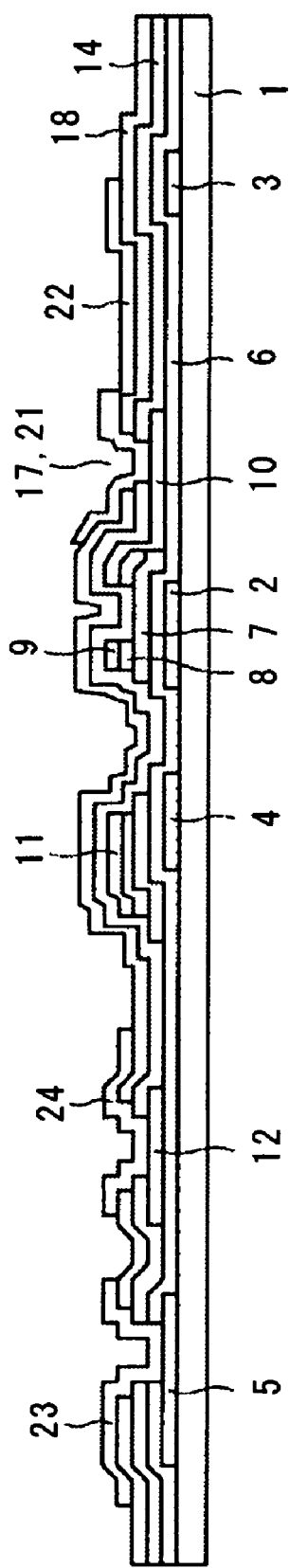
FIG. 14 is a sectional view showing a process for manufacturing the TFT array substrate for a liquid crystal display apparatus according to the first embodiment of the present invention.

As shown in FIGS. 10, 12, and 14, of the third conductive layer, the pixel electrode 22 is electrically connected to the drain electrode 10 through the contact holes 17 and 21. Further, the gate terminal pad 23 is electrically connected to the gate terminal 5 through the contact holes 15 and 19. Meanwhile, the source terminal pad 24 is connected to the source terminal 12 through the contact holes 16 and 20. Further, the pixel electrode 22 is electrically insulated from the drain electrode 10 by at least one of the interlayer insulating films 14, 18.

Hence, in the TFT array substrate according to this embodiment, an interlayer insulating film having a laminated structure constituted by at least two layers, i.e. the interlayer insulating films 14, 18, is formed between the first conductive layer and third conductive layer, and between the second conductive layer and third conductive layer. Further, the contact holes formed in the interlayer insulating films 14, 18 are formed in at least two steps.

A method of manufacturing this TFT array substrate for a liquid crystal display apparatus will now be described with reference to FIG. 2 and FIGS. 3 to 14. Similarly to FIG. 2, the sectional views included in FIGS. 3 to 14 illustrate the sectional structure of the gate terminal portion and source terminal portion in accordance with the manufacturing processes thereof, in addition to the cross-section of I-I in FIG. 1.

(A) First Step

Figure 3:
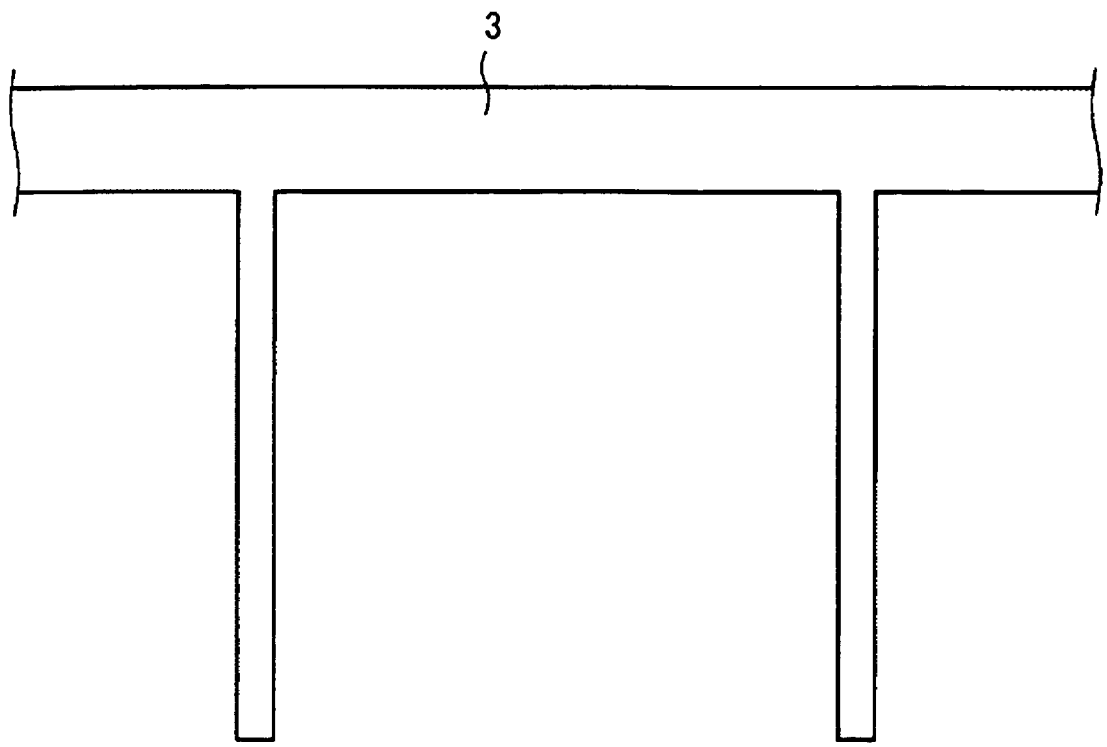
FIG. 3 is a plan view showing a process for manufacturing the TFT array substrate for a liquid crystal display apparatus according to the first embodiment of the present invention.
Figure 3:
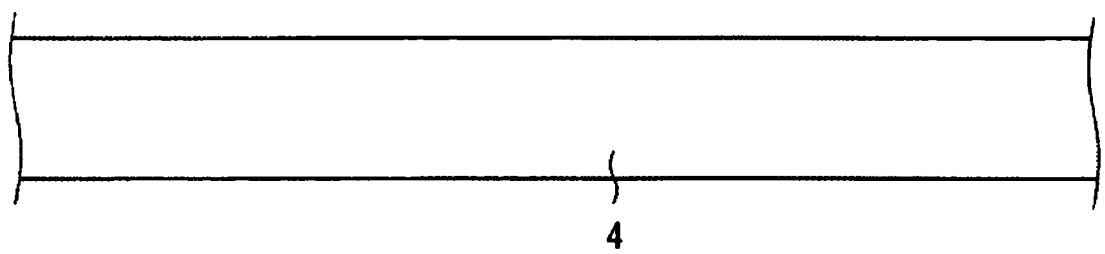
Figure 4:
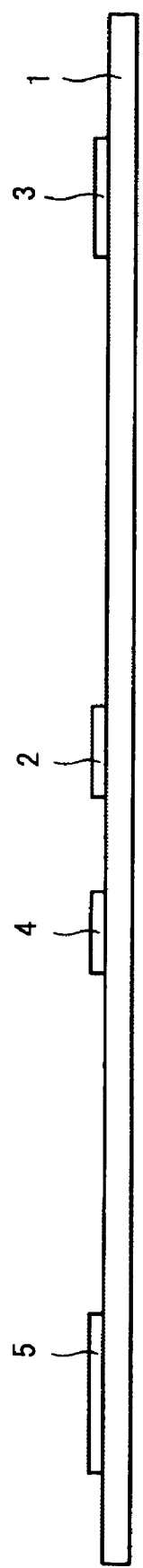
FIG. 4 is a sectional view showing a process for manufacturing the TFT array substrate for a liquid crystal display apparatus according to the first embodiment of the present invention.

First, a first metallic thin film is deposited on the transparent insulating substrate 1, such as a glass substrate. Next, the first metallic thin film is patterned using a first photolithography process (photoengraving process). As a result, at least the gate electrode 2, the storage capacitor common electrode 3, the gate wiring 4, and the gate terminal 5 are formed, as shown in FIGS. 2, 3, and 4. Al (aluminum) or Mo (molybdenum), which have a low electric specific resistance value, or an alloy having Al or Mo as a main component, may be used favorably as the first metallic thin film.

As a preferred example, first an Al film is deposited on the transparent insulating substrate 1 at a thickness of 200 nm using a well-known sputtering method employing Ar gas. The sputtering conditions are set in accordance with a DC magnetron sputtering method such that the deposition power density is 3 W/cm$^2$ and the Ar gas flow rate is 40 sccm.

Next, an AlN alloy having an added nitrogen (N) atom is deposited at a thickness of 50 nm using a well-known reactive sputtering method employing a mixture of Ar gas and N$_2$ gas. The sputtering conditions are set such that the deposition power density is 3 W/cm$^2$, the Ar gas flow rate is 40 sccm, and the N$_2$ gas flow rate is 20 sccm. As a result, a two-layer film comprising a 200 nm thick Al film and a 50 nm thick AlN film thereabove is formed as the first metallic thin film. Note that the N element abundance of the upper layer AlN film at this time is set at approximately 18 wt %, for example.

Next, a resist pattern is formed, and following etching of the two-layer film using a well-known solution containing phosphoric acid+nitric acid, the resist pattern is removed. As a result, the respective patterns of the gate electrode 2, storage capacitor common electrode 3, gate wiring 4, and gate terminal 5 are formed as shown in FIGS. 2, 3, and 4.

Here, the gate terminal 5 is disposed on the line of extension of the gate wiring 4, and the storage capacitor common electrode 3 is not electrically connected to the gate wiring 4 and the gate terminal 5.

(B) Second Step

Figure 5:
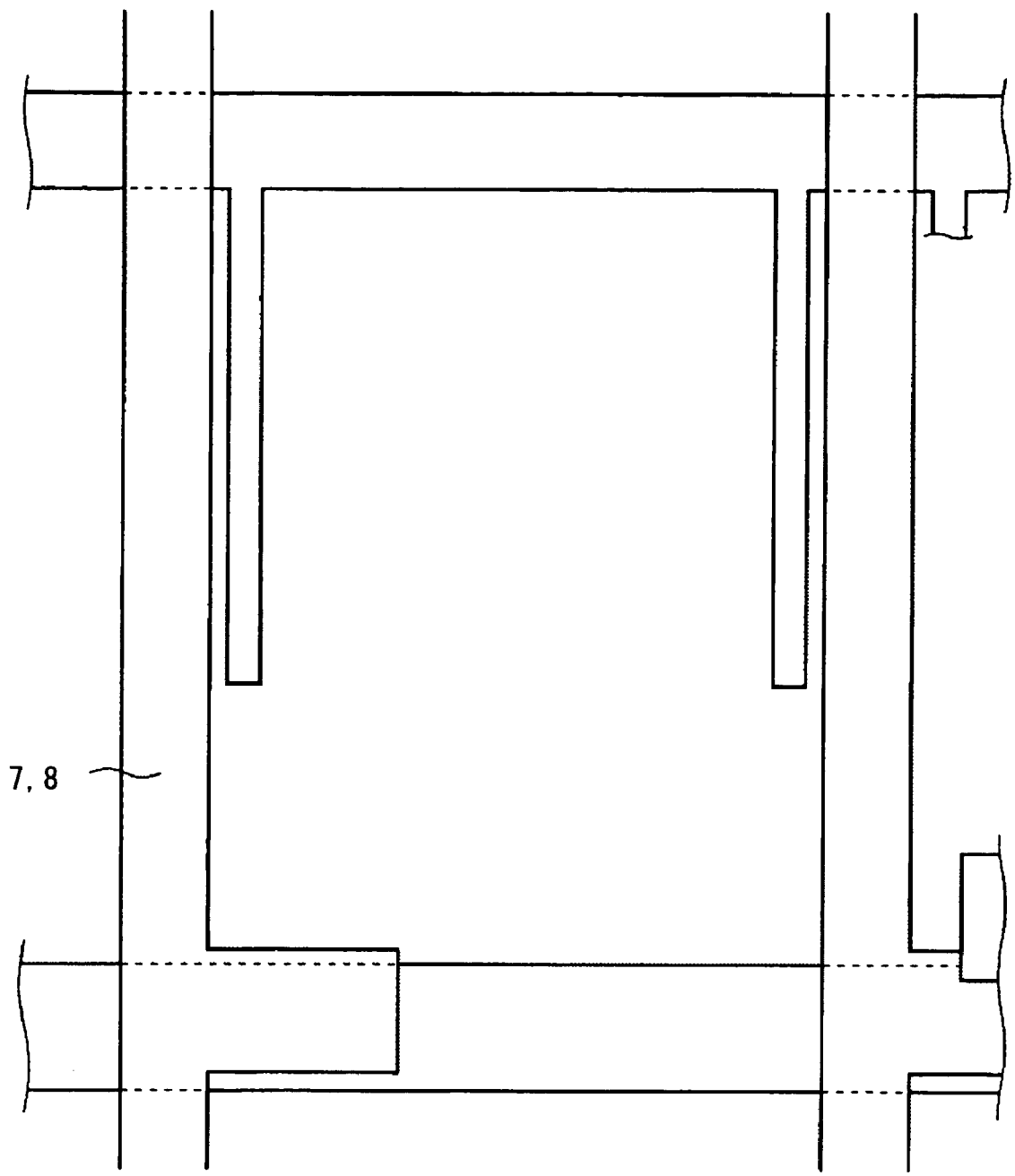
FIG. 5 is a plan view showing a process for manufacturing the TFT array substrate for a liquid crystal display apparatus according to the first embodiment of the present invention.
Figure 6:
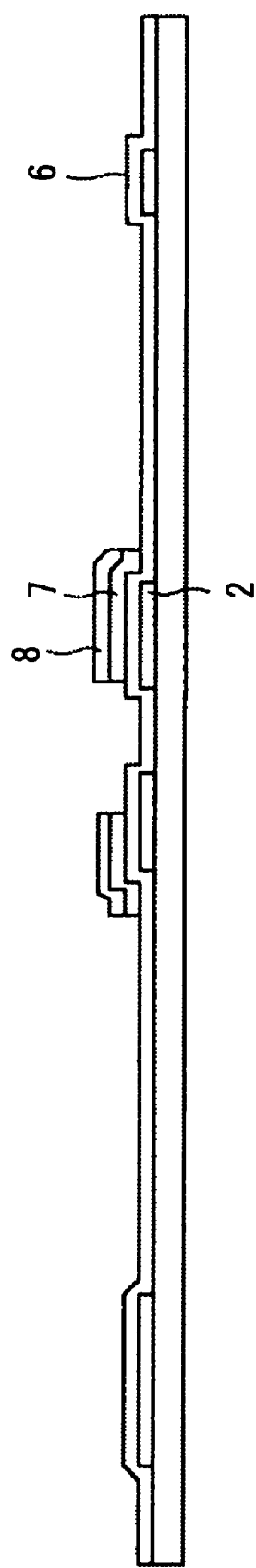
FIG. 6 is a sectional view showing a process for manufacturing the TFT array substrate for a liquid crystal display apparatus according to the first embodiment of the present invention.

Next, the first insulating film (gate insulating film) 6, a semiconductor active film 7 made of silicon or the like, and an ohmic contact film 8 made of silicon with an added impurity atom or the like are deposited in sequence. The patterns of the semiconductor active film 7 and ohmic contact film 8 are then formed in a second photolithography process (photoengraving process), as shown in FIGS. 2, 5, and 6. At this time, the shapes of the semiconductor active film 7 and ohmic contact film 8 are set to be large and continuous, encompassing a region for forming a thin film transistor (TFT) and a pattern formation region for a source electrode 9 and the source wiring 11, which are formed in a third step to be described below.

In a preferred example of the second step, first, using a chemical vapor deposition (CVD) method, a silicon nitride (SiNx, where x is a positive number) film serving as the first insulating film (gate insulating film) 6, an amorphous silicon (a-Si) film serving as the semiconductor active film 7, and an n$^+$ type amorphous silicon (n$^+$ a-Si) film to which phosphorous (P) has been doped as an impurity atom, which serves as the ohmic contact film 8, are deposited in sequence at a thickness of 400 nm, a thickness of 150 nm, and a thickness of 30 nm, respectively. A resist pattern is then formed, and following etching of the amorphous silicon film and the ohmic contact film 8 using a well-known dry etching method employing a fluorine gas, the resist pattern is removed. As a result, the semiconductor films 7, 8 are formed.

(C) Third Step

Figure 7:
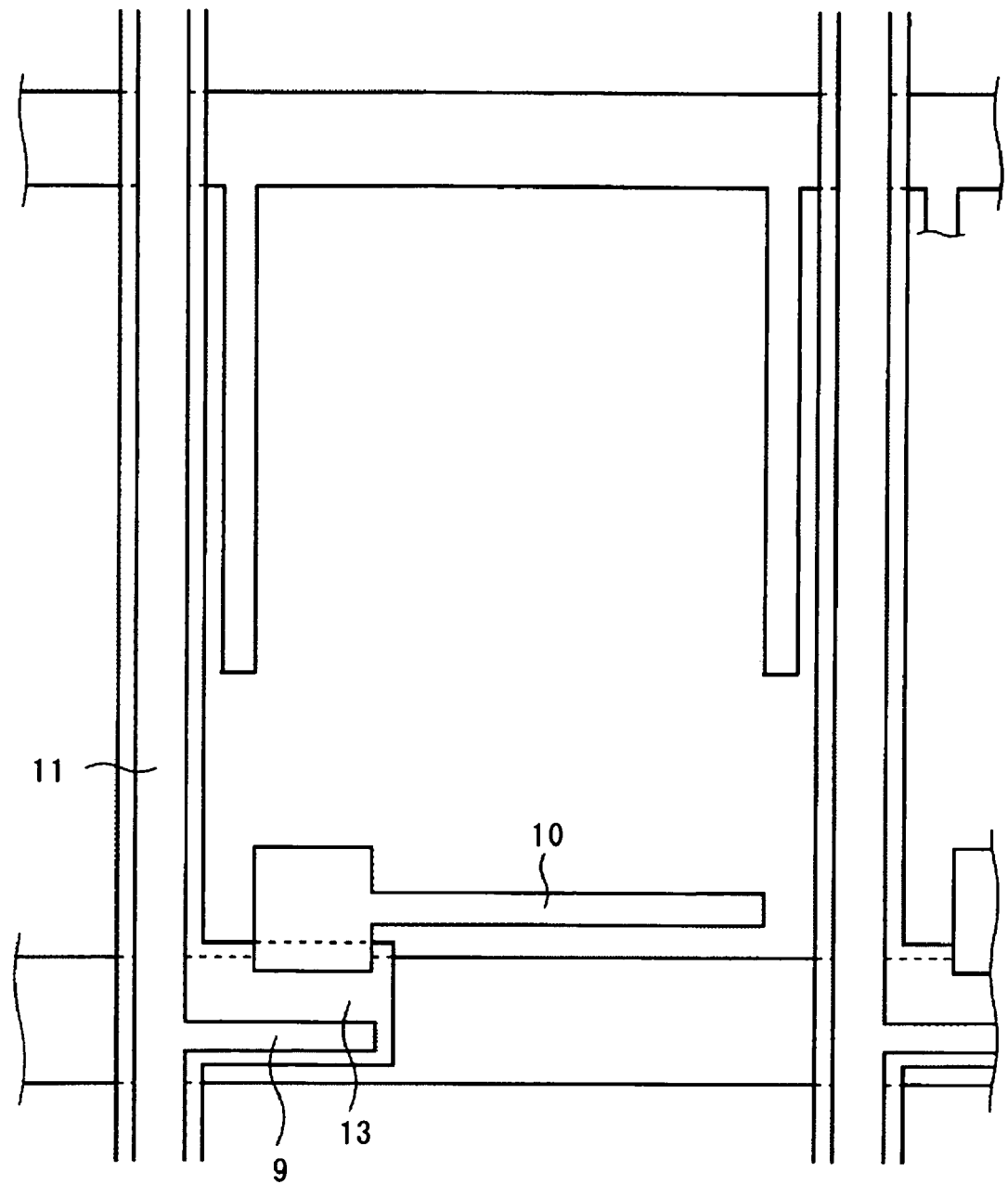
FIG. 7 is a plan view showing a process for manufacturing the TFT array substrate for a liquid crystal display apparatus according to the first embodiment of the present invention.
Figure 8:
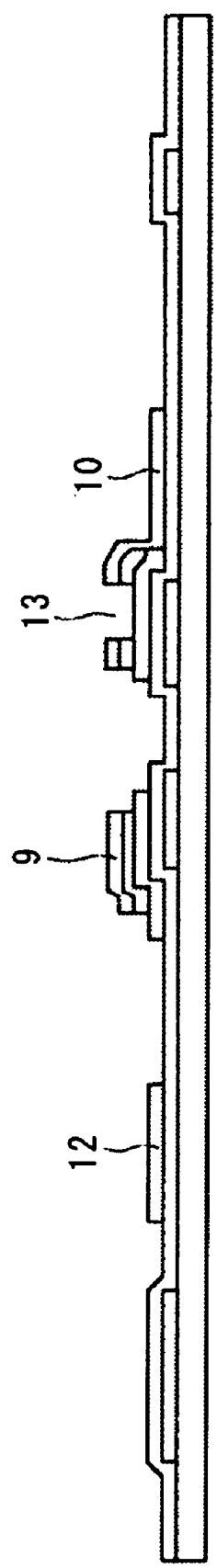
FIG. 8 is a sectional view showing a process for manufacturing the TFT array substrate for a liquid crystal display apparatus according to the first embodiment of the present invention.

Next, a second metallic thin film is deposited, whereupon the second metallic thin film is patterned in a third photolithography process (photoengraving process). As a result, the source electrode 9, drain electrode 10 (pixel drain), source wiring 11, and source terminal 12 are formed, as shown in FIGS. 2, 7, and 8.

A material which has a low electric specific resistance value, a favorable contact characteristic with the ohmic contact film 8, an excellent contact characteristic with the pixel electrode 22 to be formed in a subsequent process, and other advantages is preferably used as the second metallic thin film. For example, an alloy having molybdenum (Mo), which possesses these characteristics, as a base and niobium (Nb), tungsten (W), or another element as an additive may be selected as the second metallic thin film.

In a preferred example of the third step, first an MoNb alloy obtained by adding no more than 10 wt %, for example 5 wt %, of Nb to Mo is deposited as the second metallic thin film at a thickness of 200 nm using a well-known sputtering method employing Ar gas. Next, a resist pattern is formed and the second metallic thin film is etched using a well-known solution containing phosphoric acid+nitric acid. Next, the ohmic contact film 8 between at least the source electrode 9 and the drain electrode 10 is removed using a well-known dry etching method employing a fluorine gas, whereupon the resist pattern is removed. As a result, the source electrode 9, drain electrode 10, source wiring 11, and source terminal 12 are formed. At this time, a TFT channel portion 13 is also formed.

(D) Fourth Step

Figure 9:
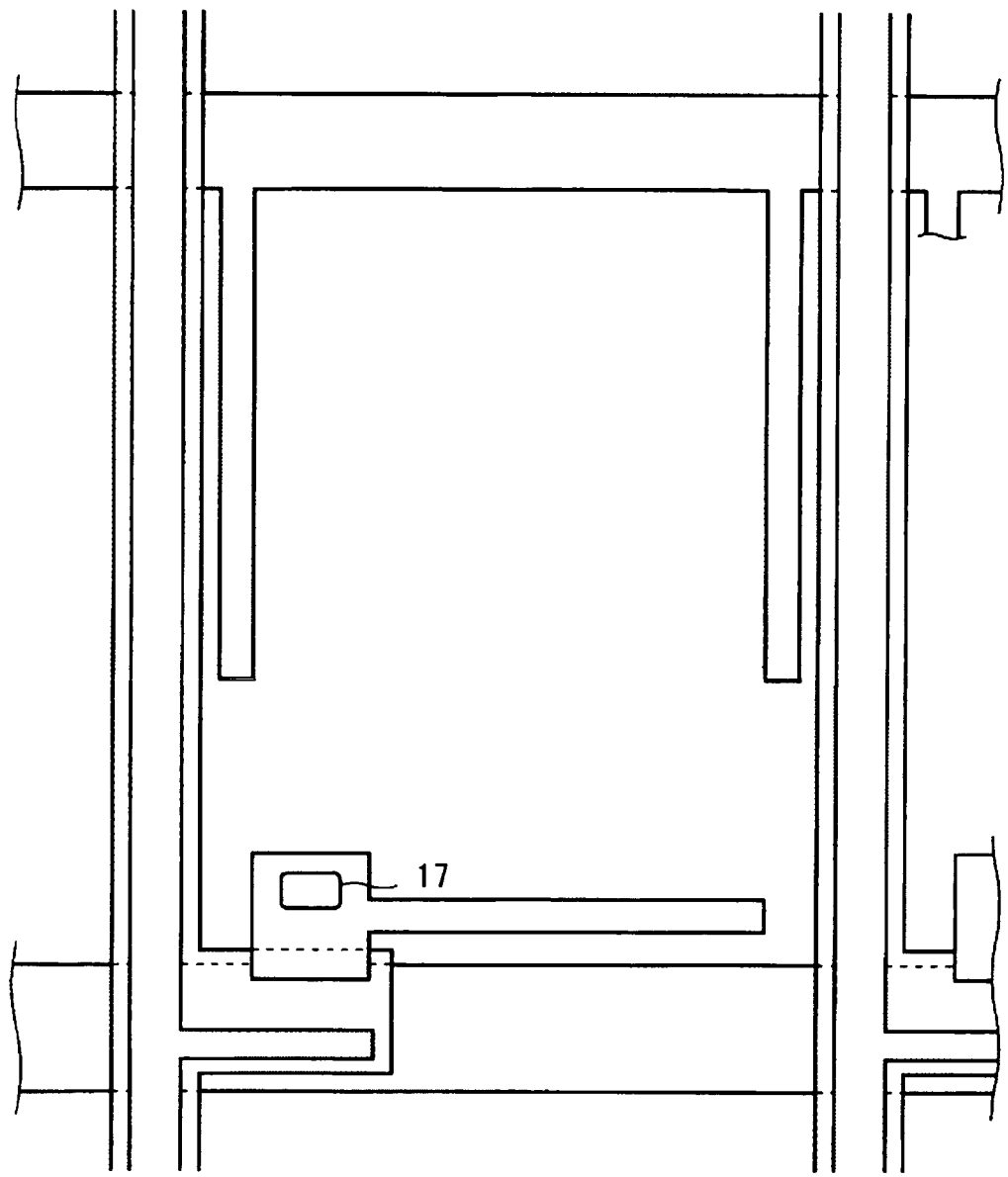
FIG. 9 is a plan view showing a process for manufacturing the TFT array substrate for a liquid crystal display apparatus according to the first embodiment of the present invention.

Next, the first interlayer insulating film 14 is deposited as the lower layer of the second insulating film. The first interlayer insulating film 14 is then patterned in a fourth photolithography process (photoengraving process). As a result, the contact hole 15 which penetrates at least to the surface of the gate terminal 5 of the first metallic thin film, the contact hole 16 which penetrates to the surface of the source terminal 12 of the second metallic thin film, and the contact hole 17 which penetrates to the surface of the drain electrode 10 are formed simultaneously in the first interlayer insulating film 14, as shown in FIGS. 2, 9, and 10.

In a preferred example of the fourth step, first a silicon nitride (SiNx) film serving as the first interlayer insulating film 14 is deposited at a thickness of 200 nm using a CVD method. Next, a resist pattern is formed and the silicon nitride film is etched using a well-known dry etching method employing a fluorine gas, whereupon the resist pattern is removed. As a result, the contact hole 15 for the gate terminal 5, the contact hole 16 for the source terminal 12, and the contact hole 17 for the drain electrode 10 (pixel drain) are formed.

In this case, if a defective portion exists in the resist pattern due to an air bubble or the like, a pin hole 25 is formed when the silicon nitride film (the first interlayer insulating film 14) is etched directly beneath the defective portion.

(E) Fifth Step

Figure 11:
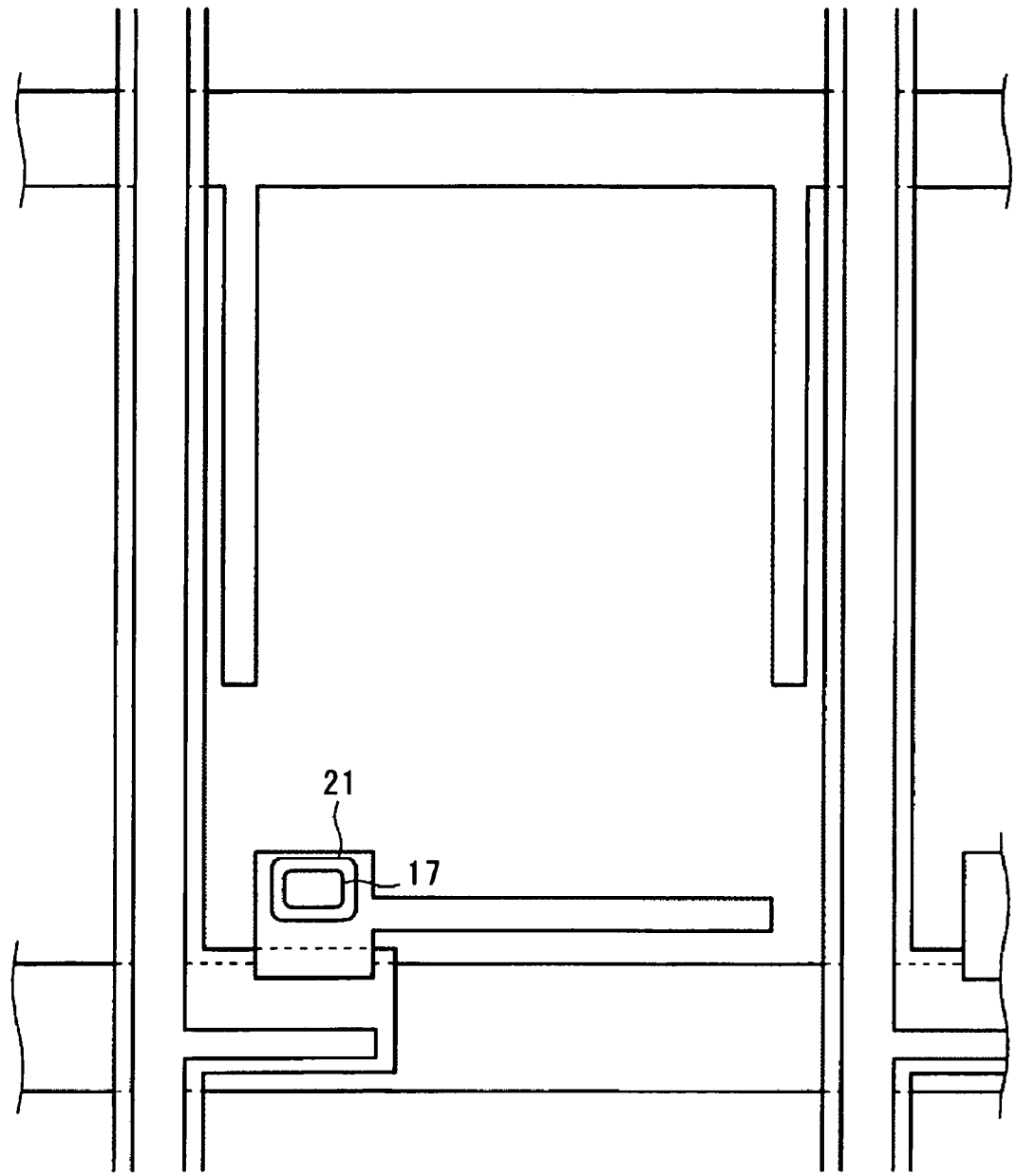
FIG. 11 is a plan view showing a process for manufacturing the TFT array substrate for a liquid crystal display apparatus according to the first embodiment of the present invention.

Next, a similar process to that of the fourth step (D) is repeated as the fifth step. More specifically, the second interlayer insulating film 18 is deposited as the upper layer of the second insulating film. The second interlayer insulating film 18 is then patterned in a fifth photolithography process (photoengraving process). As a result, the contact hole 19 for the gate terminal 5, the contact hole 20 for the source terminal 12, and the contact hole 21 for the drain electrode (pixel electrode) 10 are formed in a similar manner to the fourth step (D), as shown in FIGS. 2, 11, and 12.

At this time, the contact holes 19, 20, 21 preferably have a larger outer diameter dimension than the contact holes 15, 16, 17 formed in the fourth step (D) and corresponding respectively thereto. In other words, the sectional form of each contact hole is preferably stepped.

Further, the film thickness of the second interlayer insulating film 18 is preferably thinner than the film thickness of the first interlayer insulating film 14.

In a preferred example of the fifth step, first a silicon nitride (SiNx) film serving as the second interlayer insulating film 18 is deposited at a thickness of 100 nm using a CVD method. Next, a resist pattern is formed and the silicon nitride film is etched using a well-known dry etching method employing a fluorine gas, whereupon the resist pattern is removed. As a result, the contact hole 19 for the gate terminal 5, the contact hole 20 for the source terminal 12, and the contact hole 21 for the drain electrode (pixel electrode) are formed.

In this case, if a defective portion exists in the resist pattern due to an air bubble or the like, a pin hole 26 is formed when the silicon nitride film (the second interlayer insulating film 18) is etched directly beneath the defective portion.

(F) Sixth Step

Figure 13:
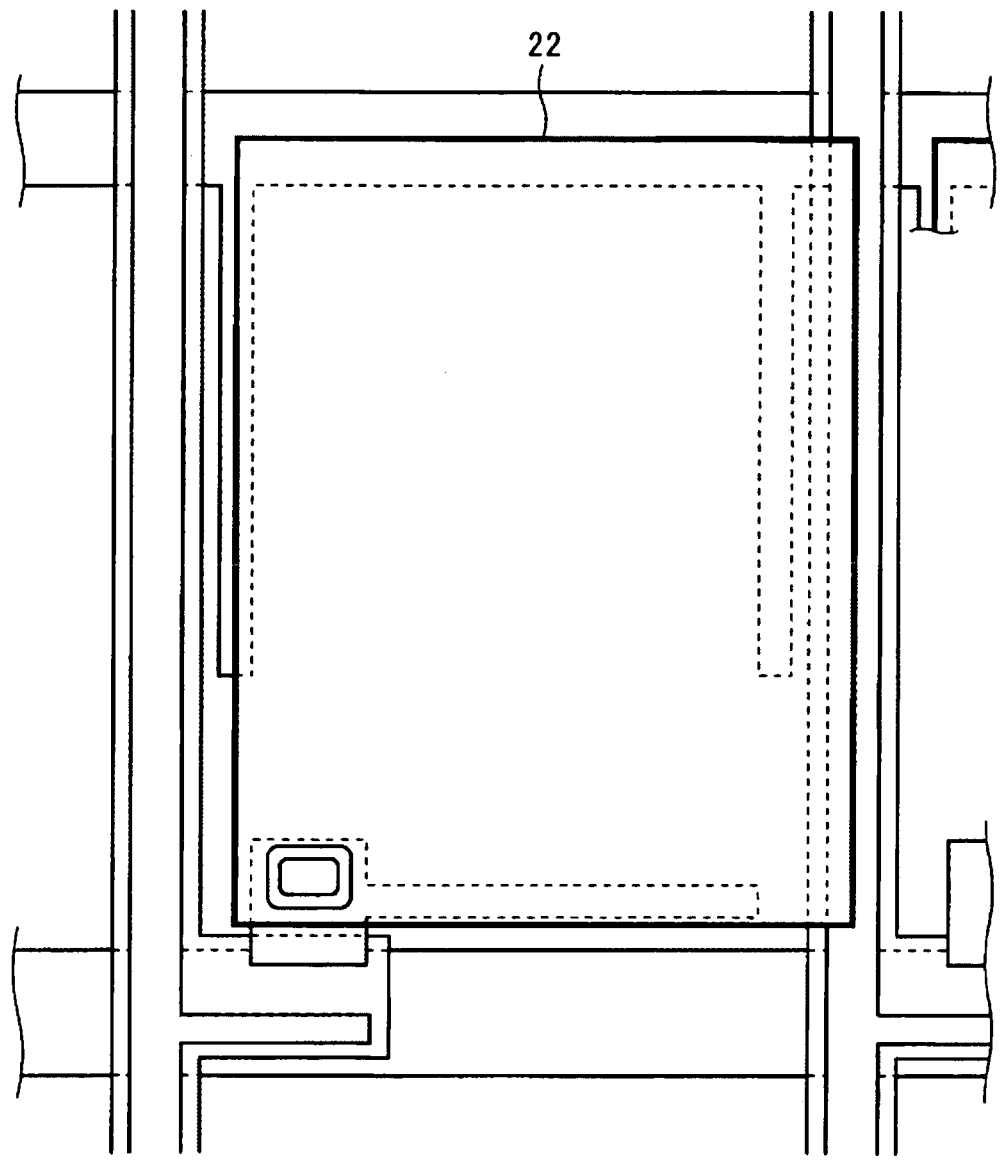
FIG. 13 is a plan view showing a process for manufacturing the TFT array substrate for a liquid crystal display apparatus according to the first embodiment of the present invention.

Finally, as shown in FIGS. 2, 13, and 14, a transparent conductive thin film is deposited, whereupon the respective patterns of the pixel electrode 22, gate terminal pad 23, and source terminal pad 24 are formed in a sixth photolithography process (photoengraving process) using the transparent conductive film. The pixel electrode 22 is electrically connected to the lower layer drain electrode 10 through the contact holes 17, 21. The gate terminal pad 23 is electrically connected to the lower layer gate terminal 5 through the contact holes 15, 19. The source terminal pad 24 is electrically connected to the lower layer source terminal 12 through the contact holes 16, 20. Thus, the TFT array substrate for a liquid crystal display apparatus according to the first embodiment reaches completion.

In a preferred example of the sixth step, first an ITO film containing a mixture of indium oxide ($In_2O_3$) and tin oxide ($SnO_2$) is deposited as the transparent conductive thin film at a thickness of 100 nm using a well-known sputtering method employing Ar gas. Next, a resist pattern is formed, and following etching using a well-known solution containing hydrochloric acid+nitric acid, the resist pattern is removed. As a result, the pixel electrode 22 for transmitting light, the gate terminal pad 23, and the source terminal pad 24 are formed.

In the TFT array substrate completed in this manner, the laminated structure constituted by two layers, i.e. the first interlayer insulating film 14 and second interlayer insulating film 18, electrically insulates the lower layer wiring and electrodes (the first conductive layer constituted by the gate electrode 2, storage capacitor common electrode 3, gate wiring 4, and gate terminal 5, and the second conductive layer constituted by the drain electrode 10, source wiring 11, and source terminal 12) from the upper layer wiring and electrodes (the third conductive layer constituted by the pixel electrode 22, gate terminal pad 23, and source terminal pad 24). Hence, in comparison with an example in which only a single-layer interlayer insulating film is provided, electrical short-circuits between the lower layer and upper layer wiring and electrodes and display defects caused by such electrical short-circuits can be prevented effectively.

Figure 15:
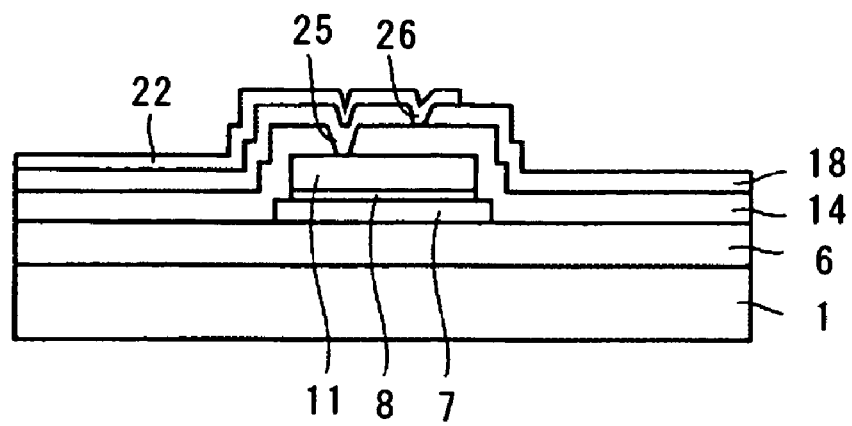
FIG. 15 is a sectional view showing a part of the TFT array substrate for a liquid crystal display apparatus according to the first embodiment of the present invention.
Figure 16:
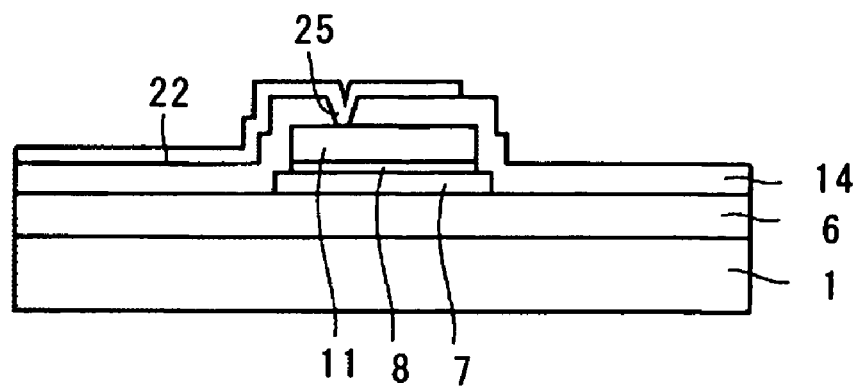
FIG. 16 is a sectional view showing a part of a TFT array substrate for a liquid crystal display apparatus according to a comparative example.

FIG. 15 shows a cross-section of an overlapping portion between the upper layer pixel electrode 22 and the lower layer source electrode 11. FIG. 15 shows a cross-section taken in a location indicated by II-II in FIG. 1. Further, for comparison, FIG. 16 shows a cross-section taken in a case where only a single-layer interlayer insulating film is provided. The pin hole defects 25, 26 occur in the first interlayer insulating film 14 and second interlayer insulating film 18 due to defects such as film fractures and air bubbles which form in the resist pattern during pattern formation of the contact holes and so on.

In FIG. 16, only the interlayer insulating film 14 is provided, and hence the surface of the source wiring 11 is exposed by the pin hole defect 25. As a result, an electrical short-circuit occurs between the source wiring 11 and the pixel electrode 22 during deposition of the transparent conductive thin film. On the other hand, in FIG. 15, which shows the first embodiment, the pin hole defect 25 and the pin hole defect 26 are formed in different positions, and therefore the source wiring 11 is not exposed. Accordingly, an electrical short-circuit does not occur between the source wiring 11 and pixel electrode 22. Needless to say, when the pin hole defect 25 and the pin hole defect 26 occur in the same position in FIG. 15, an electrical short-circuit occurs between the source wiring 11 and pixel electrode 22. However, the probability of the pin hole defect 25 in the first interlayer insulating film 14 and the pin hole defect 26 in the second interlayer insulating film 18 occurring in exactly the same position and overlapping is extremely low. Therefore, with the invention according to the first embodiment, electrical short-circuits and display defects caused by such electrical short-circuits can be prevented effectively.

Moreover, in the first embodiment the outer diameter dimension of the plurality of contact holes 19, 20, 21 formed in the second interlayer insulating film 18 is set to be larger than the outer diameter dimension of the contact holes 15, 16, 17 in the first interlayer insulating film 14 corresponding respectively thereto, as shown in FIGS. 1 and 2. As a result, disconnection faults can be prevented from occurring in the contact hole stepped portions of the upper layer electrode films, i.e. the pixel electrode 22, the gate terminal pad 23, and the source terminal pad 24.

Further, the film thickness of the second interlayer insulating film 18 is set to be thinner than the film thickness of the first interlayer insulating film 14. In so doing, etching may be performed using a well-known dry etching method employing fluorine gas so that only the second interlayer insulating film 18 is penetrated, even when the pin hole defects 25, 26 and so on are formed by defects such as air bubbles in the resist pattern. Therefore, taking into account in-plane uniformity of the silicon nitride (SiNx) film formed using etching and a CVD method, the etching time can be reduced to a minimum, and improvements in reliability and yield can be achieved.

Hence, an electro-optical display apparatus manufactured by adhering the TFT array substrate according to the first embodiment to a counter substrate having a common electrode, a color filter, and so on, and inserting liquid crystal serving as an electro-optical material therebetween, can be provided as a liquid crystal display apparatus at an improved yield and an improved production capacity, enabling a reduction in production cost and a reduction in price.

Furthermore, this embodiment is not limited to a liquid crystal display apparatus, and by pattern-forming a light-emitting electro-optical material such as electroluminescence (EL) on the pixel electrode 22 of the TFT array substrate according to the first embodiment, and adhering the TFT array substrate of the first embodiment to a counter substrate such that the EL pattern is sealed, an EL type display apparatus can be manufactured at a high yield.

Note that in the first embodiment, a two-layer laminated structure constituted by the interlayer insulating film 14 and the interlayer insulating film 18 is formed, but the present invention is not limited thereto, and a structure having three or more layers may be formed by forming another interlayer insulating film on the second interlayer insulating film, for example. As the number of layers increases, film fractures and pin hole defects occurring in each of the layers can be compensated for with increasing certainty. Note, however, that in practice, film fractures and pin holes can be compensated for substantially by a two-layer structure. Therefore, to prevent the manufacturing process from becoming excessively complicated, the interlayer insulating film preferably takes a two-layer structure or at most a three-layer structure.

As described above, a two-layer laminated structure constituted by the interlayer insulating film 14 and the interlayer insulating film 18 is formed, and the contact holes formed in the interlayer insulating films 14, 18 are formed in at least two steps. Hence, even when pin holes and fractures occur in the interlayer insulating films 14, 18, short-circuit defects between electrodes in locations other than the contact holes can be prevented, and a highly reliable electro-optical apparatus can be manufactured at a high yield.

Second Embodiment

Figure 17:
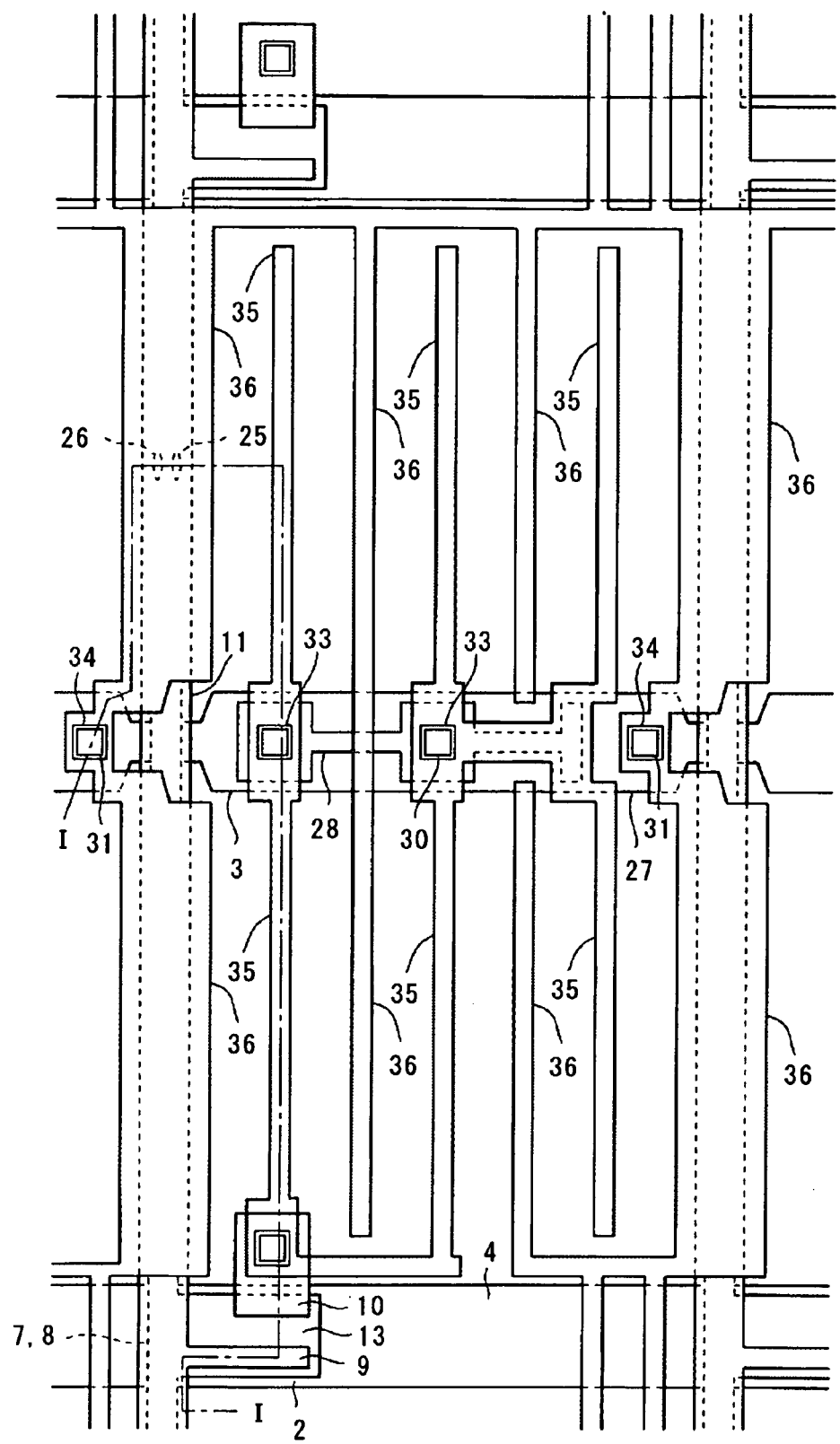
FIG. 17 is a plan view of a TFT array substrate for a liquid crystal display apparatus according to a second embodiment of the present invention.
Figure 18:
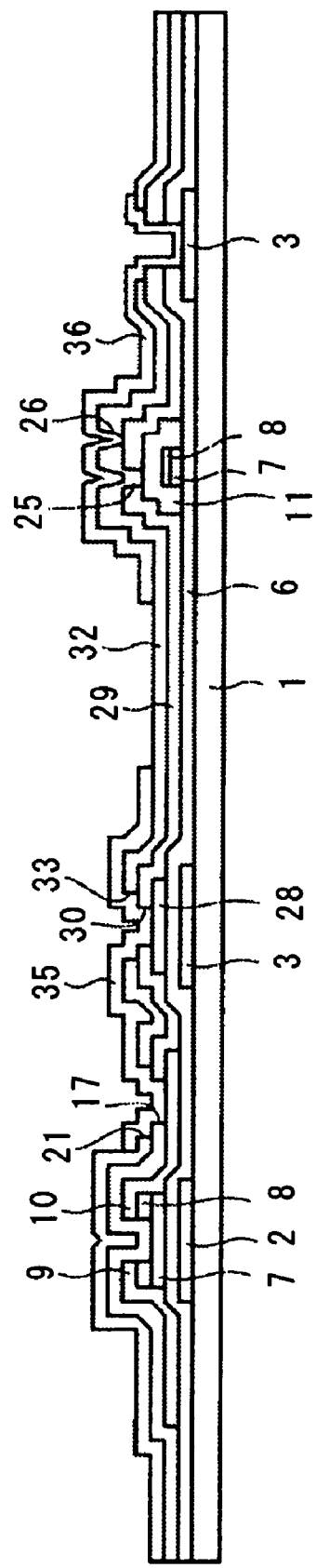
FIG. 18 is a sectional view of the TFT array substrate for a liquid crystal display apparatus according to the second embodiment of the present invention.

FIG. 17 shows a plan view of a TFT array substrate for a liquid crystal display apparatus according to a second embodiment of the present invention, while FIG. 18 shows a sectional view thereof. The sectional view in FIG. 18 shows the sectional structure of a gate terminal portion and a source terminal portion in addition to the cross-section of I-I in FIG. 17. Note that in the second embodiment, elements having identical functions to those of the first embodiment have been allocated identical reference numerals.

As shown in FIGS. 17 and 18, this TFT array substrate for a liquid crystal display apparatus comprises a pixel electrode 35 and a counter electrode 36. The pixel electrode 35 and counter electrode 36 are disposed so as to face each other. The pixel electrode 35 is electrically connected to the drain electrode 10 through the contact holes 17, 21, and electrically connected to a storage capacitor contact film 28 through contact holes 30, 33. Meanwhile, the counter electrode 36 is electrically connected to the storage capacitor common electrode 3 through contact holes 31, 34. The TFT array substrate according to this embodiment is structured such that an electric field is applied between the pixel electrode 35 and counter electrode 36 in a direction that is substantially parallel to the film surface. A method of manufacturing this TFT array substrate for a liquid crystal display apparatus will now be described with reference to FIGS. 18 to 30.

(A) First Step

First, a first metallic thin film is deposited on the transparent insulating substrate 1, such as a glass substrate. Next, the first metallic thin film is patterned in a first photolithography process (photoengraving process). As a result, at least the gate electrode 2, the storage capacitor common electrode 3, and the gate wiring 4 are formed, as shown in FIGS. 18, 19, and 20.

Figure 19:
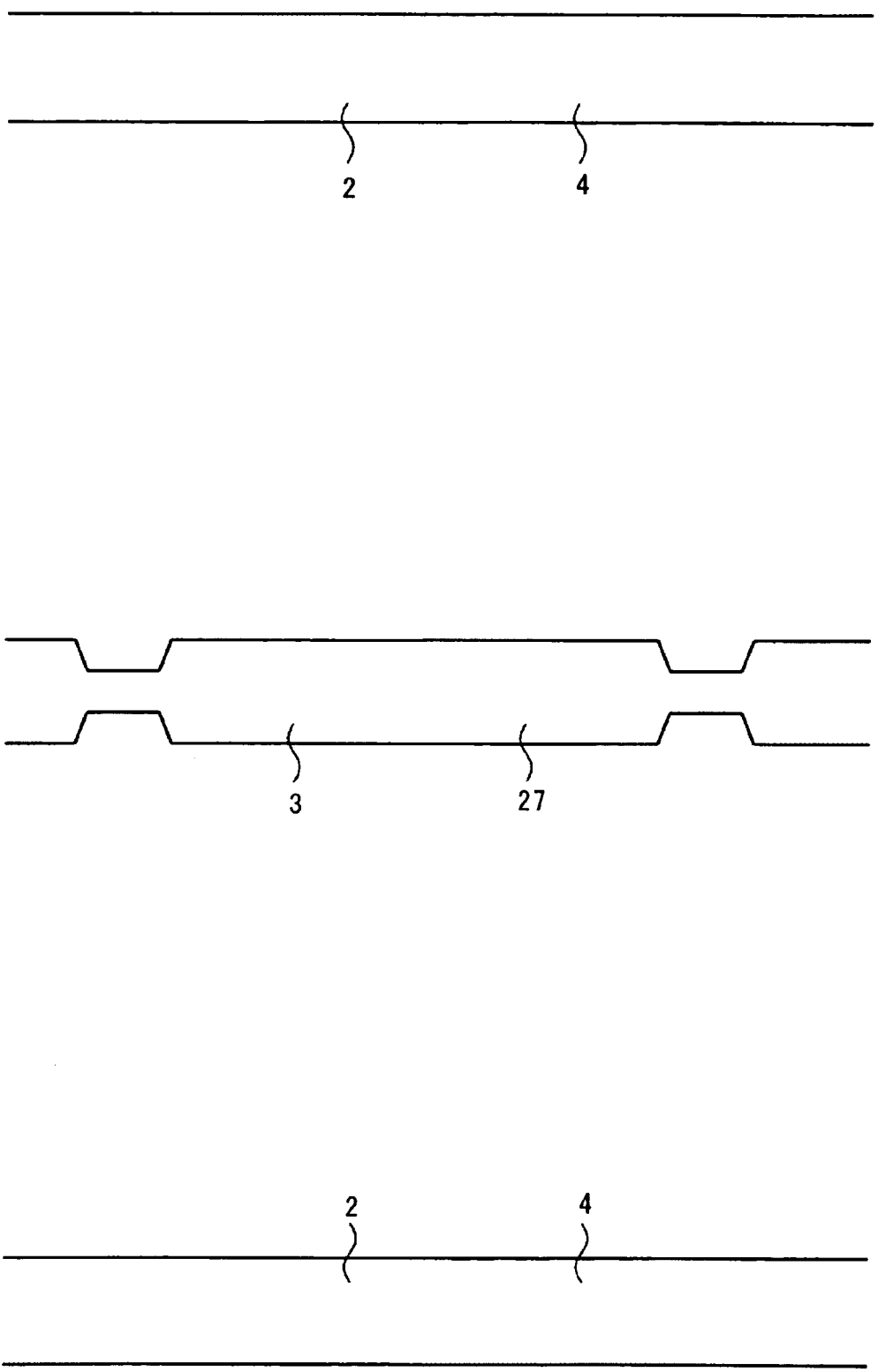
FIG. 19 is a plan view showing a process for manufacturing the TFT array substrate for a liquid crystal display apparatus according to the second embodiment of the present invention.
Figure 20:
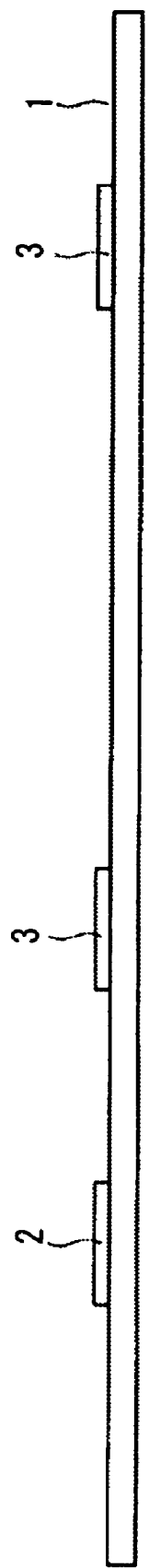
FIG. 20 is a sectional view showing a process for manufacturing the TFT array substrate for a liquid crystal display apparatus according to the second embodiment of the present invention.

Note that the storage capacitor common electrode 3 is formed by a coplanar pattern, as shown in FIG. 19. Al or Mo, which have a low electric specific resistance value, or an alloy having Al or Mo as a main component, is preferably used as the first metallic thin film.

In a preferred example of the first step, first an Al film is deposited at a thickness of 200 nm using a well-known sputtering method employing Ar gas. The sputtering conditions are set in accordance with a DC magnetron sputtering method such that the deposition power density is 3 W/cm$^2$ and the Ar gas flow rate is 40 sccm.

Next, an AlN alloy having an added nitrogen (N) atom is deposited at a thickness of 50 nm using a well-known reactive sputtering method employing a mixture of Ar gas and N$_2$ gas. The sputtering conditions are set such that the deposition power density is 3 W/cm$^2$, the Ar gas flow rate is 40 sccm, and the N$_2$ gas flow rate is 20 sccm. As a result, a two-layer film comprising a 200 nm thick Al film and a 50 nm thick AlN film thereabove is formed as the first metallic thin film. Note that the N element abundance of the upper layer AlN film at this time is set at approximately 18 wt %, for example.

Next, a resist pattern is formed, and following etching of the two-layer film using a well-known solution containing phosphoric acid+nitric acid, the resist pattern is removed. As a result, the respective patterns of the gate electrode 2, storage capacitor common electrode 3, and gate wiring 4 are formed.

(B) Second Step

Figure 21:
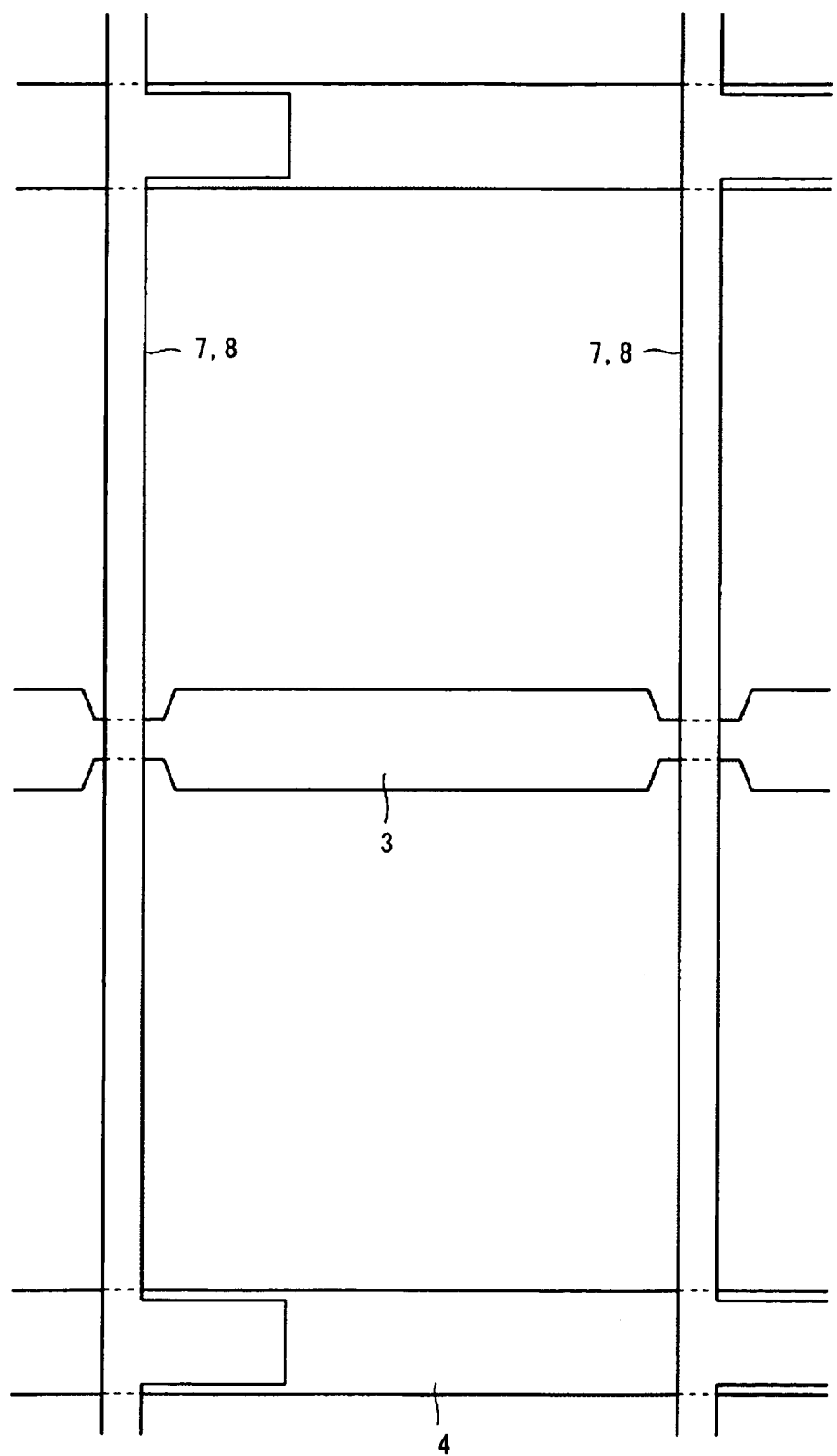
FIG. 21 is a plan view showing a process for manufacturing the TFT array substrate for a liquid crystal display apparatus according to the second embodiment of the present invention.
Figure 22:
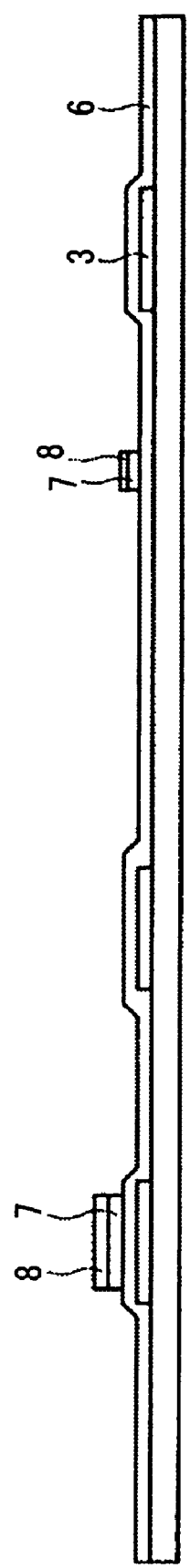
FIG. 22 is a sectional view showing a process for manufacturing the TFT array substrate for a liquid crystal display apparatus according to the second embodiment of the present invention.

Next, the first insulating film (gate insulating film) 6, a semiconductor active film 7 made of silicon or the like, and an ohmic contact film 8 made of silicon with an added impurity atom or the like are deposited in sequence. The semiconductor active film 7 and ohmic contact film 8 are then patterned in a second photolithography process (photoengraving process), as shown in FIGS. 18, 21, and 22. At this time, the semiconductor active film 7 and ohmic contact film 8 include a region for forming a thin film transistor (TFT). Further, the semiconductor films 7, 8 have a portion extending from a formation region of the TFT to another formation region of the TFT. The source wiring 11 covers the extending portion of the semiconductor films 7, 8. The source wiring 11 is formed in a third step to be described below.

In a preferred example of the second step, using a chemical vapor deposition (CVD) method, a silicon nitride (SiNx, where x is a positive number) film serving as the first insulating film (gate insulating film) 6, an amorphous silicon (a-Si) film serving as the semiconductor active film 7, and an n$^+$ type amorphous silicon (n$^+$ a-Si) film to which phosphorous (P) has been added as an impurity atom, which serves as the ohmic contact film 8, are deposited in sequence at a thickness of 400 nm, a thickness of 150 nm, and a thickness of 30 nm, respectively. A resist pattern is then formed, and following etching of the amorphous silicon film and the ohmic contact film 8 using a well-known dry etching method employing a fluorine gas, the resist pattern is removed. As a result, the semiconductor films 7, 8 are formed.

(C) Third Step

Figure 23:
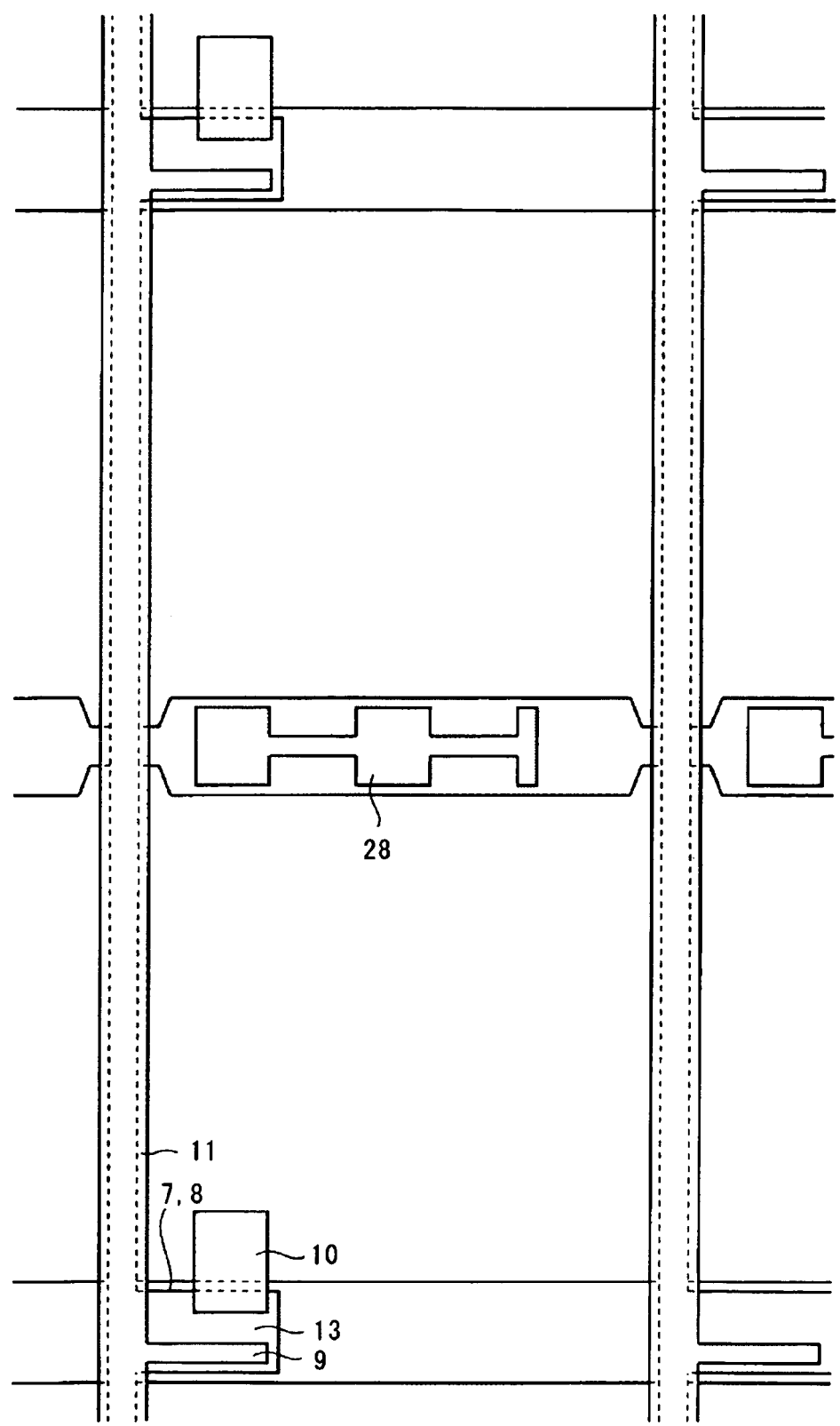
FIG. 23 is a plan view showing a process for manufacturing the TFT array substrate for a liquid crystal display apparatus according to the second embodiment of the present invention.
Figure 24:
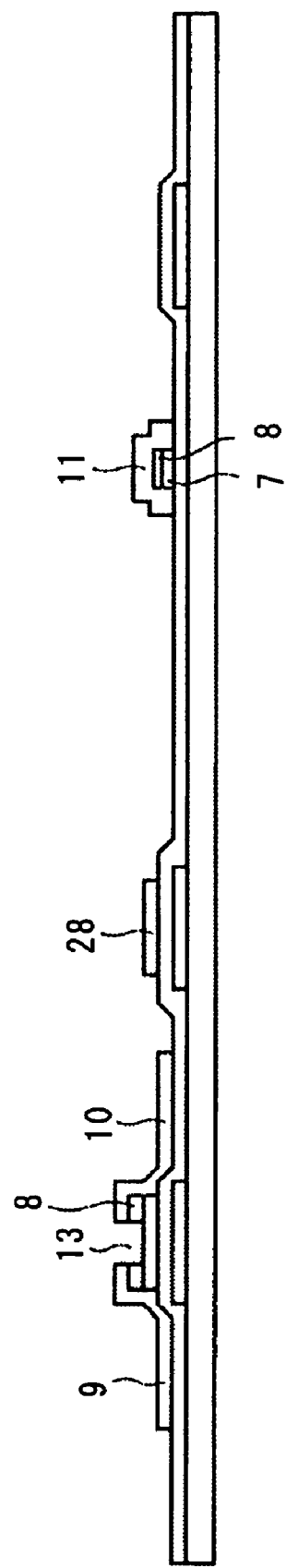
FIG. 24 is a sectional view showing a process for manufacturing the TFT array substrate for a liquid crystal display apparatus according to the second embodiment of the present invention.

Next, a second metallic thin film is deposited. The second metallic thin film is then patterned in a third photolithography process (photoengraving process), and as a result, the source electrode 9, drain electrode 10, source wiring 11, and storage capacitor contact film 28 are formed, as shown in FIGS. 18, 23, and 24. A material which has a low electric specific resistance value, a favorable contact characteristic with the ohmic contact film 8, an excellent contact characteristic with the pixel electrode 35 to be formed in a subsequent process, and other advantages is preferably used as the second metallic thin film. For example, an alloy having molybdenum (Mo), which possesses these characteristics, as a base and niobium (Nb), tungsten (W), or another element as an additive may be selected as the second metallic thin film.

In a preferred example of the third step, first an MoNb alloy obtained by adding no more than 10 wt %, for example 5 wt %, of Nb to Mo is deposited at a thickness of 200 nm using a well-known sputtering method employing Ar gas. Next, a resist pattern is formed and etching is performed using a well-known solution containing phosphoric acid+nitric acid. Next, the ohmic contact film 8 between at least the source electrode 9 and the drain electrode 10 is removed using a well-known dry etching method employing a fluorine gas, whereupon the resist pattern is removed. As a result, the source electrode 9, drain electrode 10, source wiring 11, storage capacitor contact film 28, and TFT channel portion 13 are formed.

(D) Fourth Step

Figure 25:
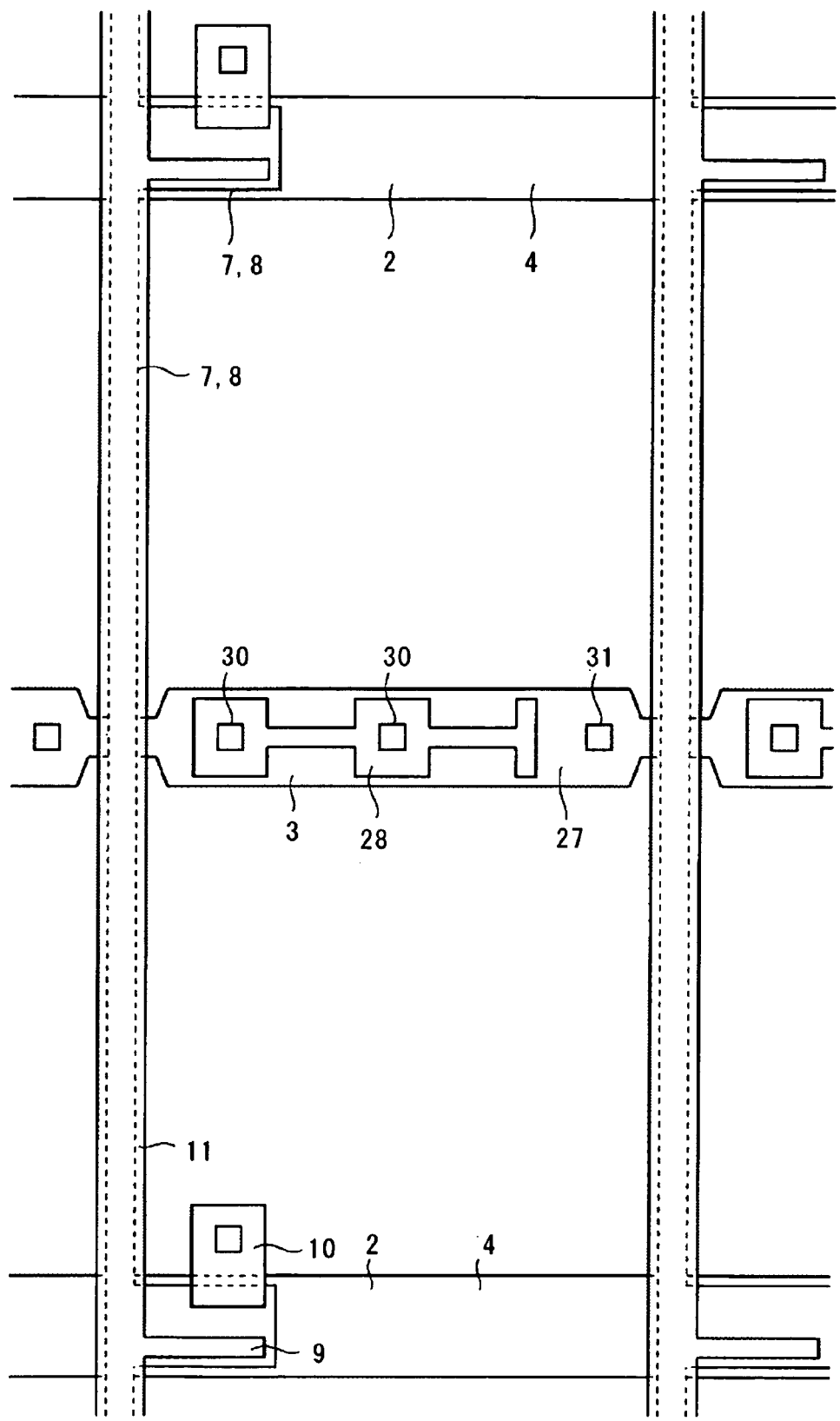
FIG. 25 is a plan view showing a process for manufacturing the TFT array substrate for a liquid crystal display apparatus according to the second embodiment of the present invention.
Figure 26:
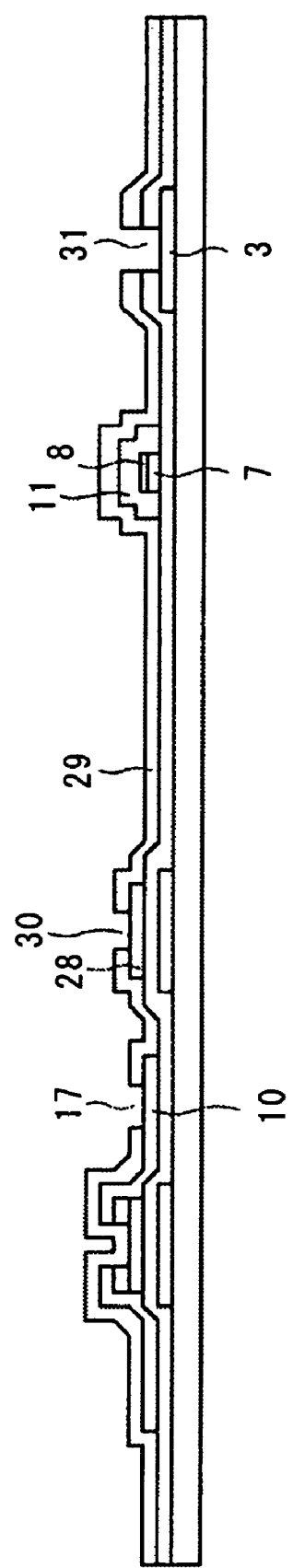
FIG. 26 is a sectional view showing a process for manufacturing the TFT array substrate for a liquid crystal display apparatus according to the second embodiment of the present invention.

Next, a first interlayer insulating film 29 is deposited as the lower layer of the second insulating film using a CVD method. The first interlayer insulating film 29 is then patterned in a fourth photolithography process (photoengraving process), as shown in FIGS. 18, 25, and 26, whereby the contact holes 31, 30, and 17 are formed simultaneously. The contact hole 31 penetrates at least to the surface of the storage capacitor common electrode 3 of the first metallic thin film. The contact hole 30 penetrates to the surface of the storage capacitor contact film 28 of the second metallic thin film. The contact hole 17 penetrates to the surface of the drain electrode 10.

In a preferred example of the fourth step, first a silicon nitride (SiNx) film serving as the first interlayer insulating film 29 is deposited at a thickness of 200 nm using a CVD method. Next, a resist pattern is formed and the silicon nitride film is etched using a well-known dry etching method employing a fluorine gas, whereupon the resist pattern is removed. As a result, the contact hole 31 for the storage capacitor common electrode 3, the contact hole 30 for the storage capacitor contact film 28, and the contact hole 17 for the drain electrode 10 (pixel drain) are formed.

In this case, if a defective portion exists in the resist pattern due to an air bubble or the like, a pin hole 25 is formed when the silicon nitride film (the first interlayer insulating film 29) is etched directly beneath the defective portion.

(E) Fifth Step

Figure 27:
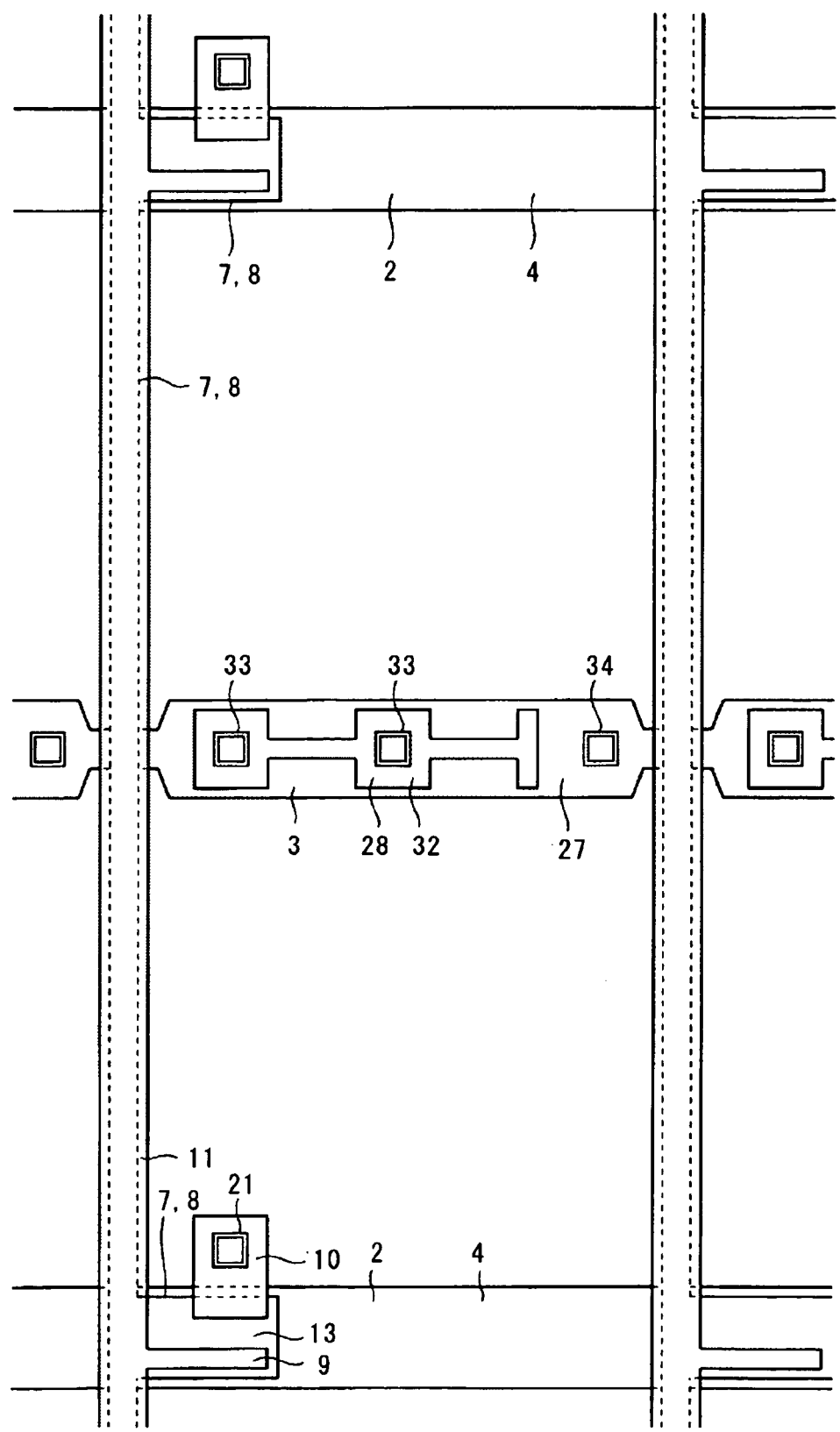
FIG. 27 is a plan view showing a process for manufacturing the TFT array substrate for a liquid crystal display apparatus according to the second embodiment of the present invention.
Figure 28:
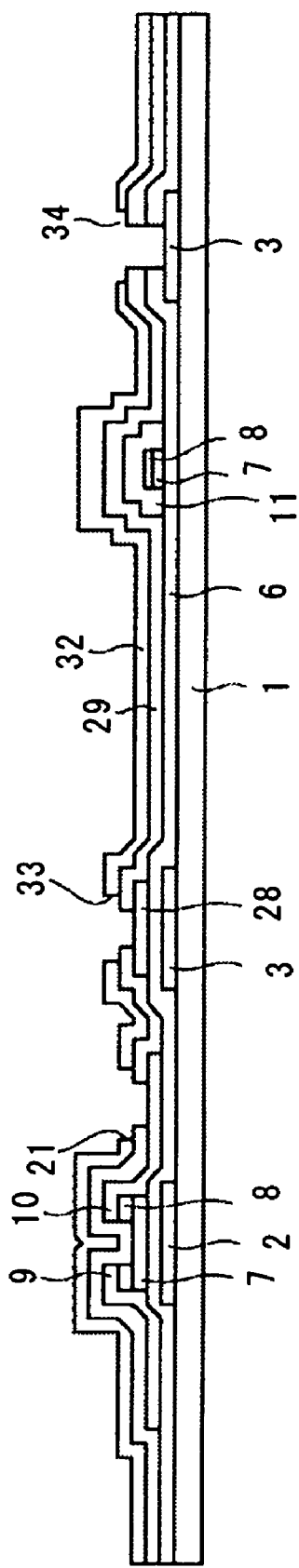
FIG. 28 is a sectional view showing a process for manufacturing the TFT array substrate for a liquid crystal display apparatus according to the second embodiment of the present invention.

Next, a similar process to that of the fourth step (D) is repeated as the fifth step. More specifically, first a second interlayer insulating film 32 is deposited as the upper layer of the second insulating film. The second interlayer insulating film 32 is then patterned in a fifth photolithography process (photoengraving process), whereby the contact hole 34 for the storage capacitor common electrode 3, the contact hole 33 for the storage capacitor contact film 28, and the contact hole 21 for the drain electrode 10 (pixel drain) are formed, as shown in FIGS. 18, 27, and 28.

At this time, the contact holes 21, 33, 34 preferably have a larger outer diameter dimension than the contact holes 17, 30, 31 formed in the fourth step (D) and corresponding respectively thereto. In other words, the sectional form of each contact hole is preferably stepped.

Further, the film thickness of the second interlayer insulating film 32 is preferably thinner than the film thickness of the first interlayer insulating film 29.

In a preferred example of the fifth step, first a silicon nitride (SiNx) film serving as the second interlayer insulating film 32 is deposited at a thickness of 100 nm using a CVD method. Next, a resist pattern is formed and the silicon nitride film is etched using a well-known dry etching method employing a fluorine gas, whereupon the resist pattern is removed. As a result, the contact hole 34 for the storage capacitor common electrode 3, the contact hole 33 for the storage capacitor contact film 28, and the contact hole 21 for the drain electrode 10 (pixel drain) are formed.

In this case, if a defective portion exists in the resist pattern due to an air bubble or the like, a pin hole 26 is formed when the silicon nitride film (the second interlayer insulating film 32) is etched directly beneath the defective portion.

(F) Sixth Step

Figure 29:
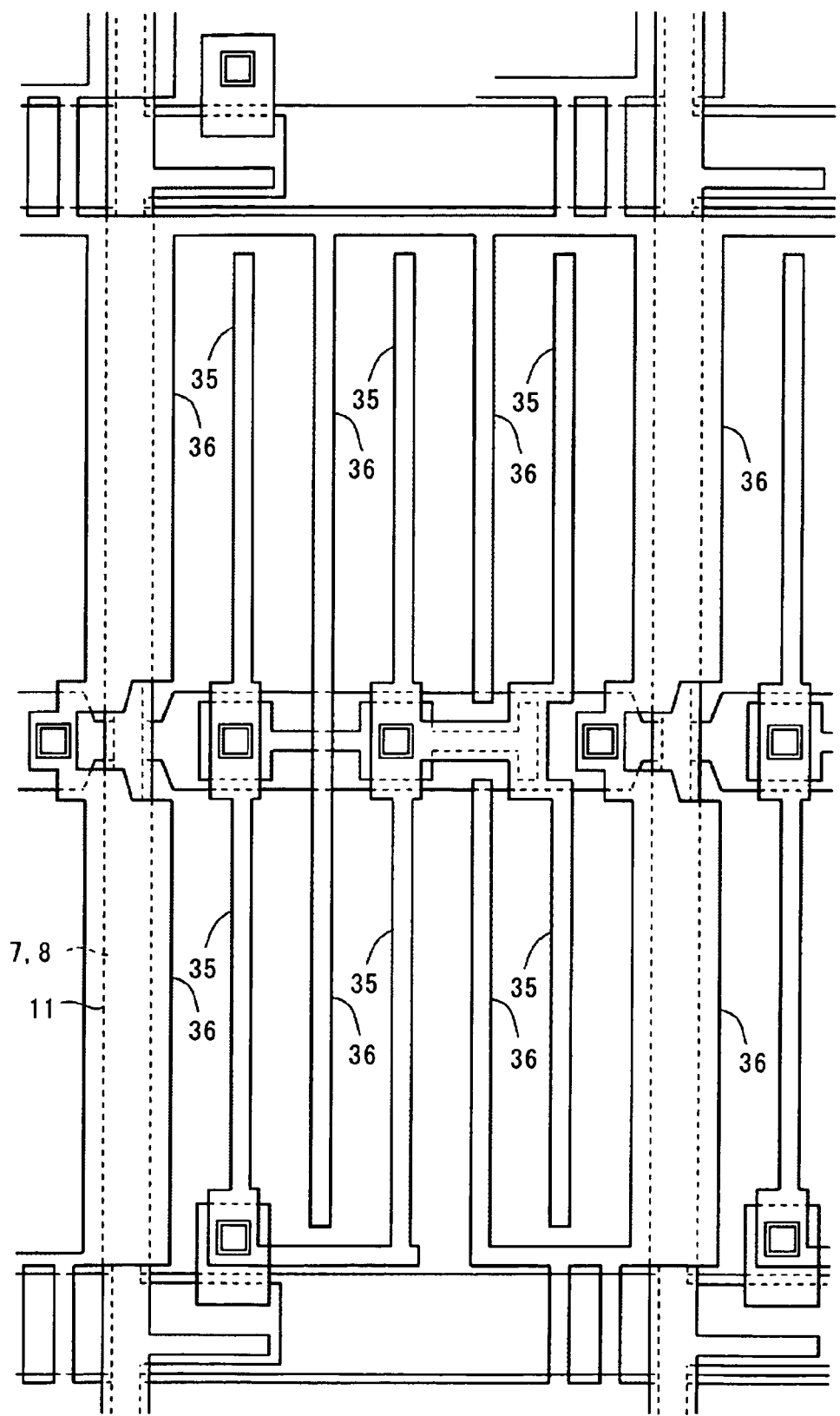
FIG. 29 is a plan view showing a process for manufacturing the TFT array substrate for a liquid crystal display apparatus according to the second embodiment of the present invention.
Figure 30:
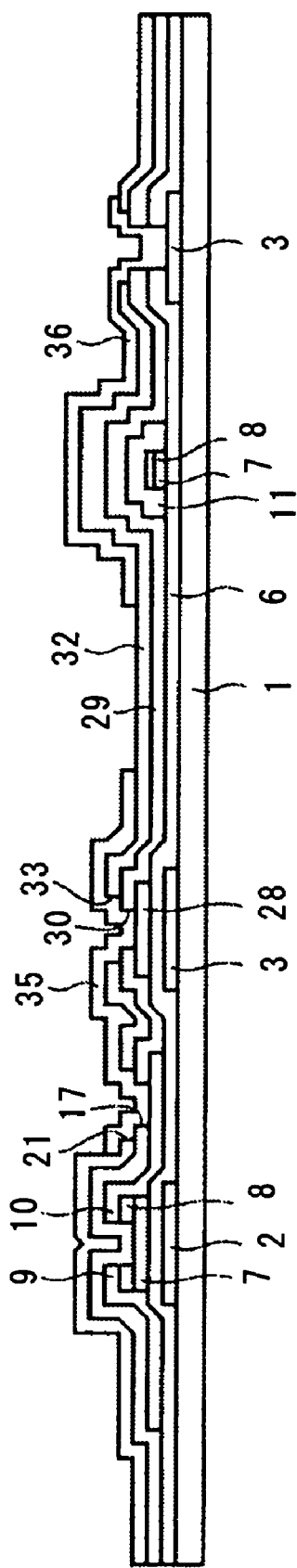
FIG. 30 is a sectional view showing a process for manufacturing the TFT array substrate for a liquid crystal display apparatus according to the second embodiment of the present invention.

Finally, as shown in FIGS. 18, 29, and 30, a transparent conductive thin film is deposited, whereupon the pixel electrode 35 and the counter electrode 36 are patterned in a sixth photolithography process (photoengraving process) using the transparent conductive thin film.

Here, the pixel electrode 35 is electrically connected to the lower layer drain electrode 10 and the storage capacitor contact film 28, respectively, through the contact holes 17, 21, 30, 33.

The counter electrode 36 is electrically connected to the lower layer storage capacitor common electrode 3 through the contact holes 31, 34. Further, the counter electrode 36 is formed such that at least a part thereof covers the top of the lower layer source wiring 11.

Thus, the TFT array substrate for a liquid crystal display apparatus according to the second embodiment of the present invention reaches completion.

In the TFT array substrate according to this embodiment, the pixel electrode 35 and counter electrode 36 are patterned so as to be completely separated from each other and such that the two electrodes oppose each other substantially in parallel on at least a part of one side of the respective patterns thereof.

In a preferred example of the sixth step, first an ITO film containing a mixture of indium oxide ($In_2O_3$) and tin oxide ($SnO_2$) is deposited as the transparent conductive thin film at a thickness of 100 nm using a well-known sputtering method employing Ar gas. Next, a resist pattern is formed, and following etching using a well-known solution containing hydrochloric acid+nitric acid, the resist pattern is removed. As a result, the pixel electrode 35 and counter electrode 36 are formed.

Similar effects to those of the first embodiment can be obtained in the second embodiment.

Additionally, in the case of the second embodiment, a similar effect to the effect described in the first embodiment using FIGS. 15 and 16 is exhibited in the region where the counter electrode 36 overlaps the lower layer source wiring 11, as shown in FIGS. 17 and 18. More specifically, when the interlayer insulating film has a single-layer structure, fractures in the interlayer insulating film, the pin hole defects 25, 26, and so on connect the two components such that an electrical short-circuit occurs. However, in this embodiment, the interlayer insulating films 29, 32 form a two-layer structure and the contact holes are formed in a process comprising two or more steps, and therefore electrical short-circuits can be prevented extremely effectively.

Hence, a lateral electric field type liquid crystal display apparatus manufactured by adhering the TFT array substrate according to the second embodiment to a counter substrate having a common electrode, a color filter, and so on, and inserting liquid crystal therebetween, can be supplied at an improved yield and an improved production capacity, enabling a reduction in production cost and a reduction in price.

Note that in the second embodiment also, a two-layer laminated structure constituted by the interlayer insulating film 29 and the interlayer insulating film 32 is formed, but the present invention is not limited to this, and a three-layer structure in which a third interlayer insulating film is formed may be employed, for example.

Further, in the first and second embodiments, the first metallic thin film is formed as a two-layer film constituted by an Al (aluminum) film and an AlN film, which is formed by adding an N (nitrogen) atom to the upper layer of the Al film. By forming the metallic thin film using Al, the electric resistance of the electrodes and wiring is reduced. Further by providing the AlN film on the upper layer, the interface contact resistance in cases such as when the gate terminal pad 23 (see FIG. 2) constituted by a transparent conductive ITO film is electrically connected to the gate terminal 5 through the contact holes 15, 19 and when the counter electrode 36 is electrically connected to the storage capacitor common electrode 3 through the contact holes 31, 34 can be improved.

Further, by forming the AlN film on the upper layer, protrusions known generally as hillocks, which occur on the surface of the Al film when the film is heated to approximately 100° C. or more, can be suppressed. Furthermore, by providing a two-layer AlN/Al structure, etching can be performed in a single process using a well-known solution containing phosphoric acid+nitric acid as an etching liquid for an Al type metal. Note that in each of the embodiments described above, an AlN film having an added N atom of approximately 18 wt % is used as the upper layer Al, but the present invention is not limited thereto. According to an evaluation conducted by the present inventor, identical effects to those of the present invention are obtained when the N atom composition added to the upper layer Al is between 5 and 26 wt %. Further, the added element is not limited to an N (nitrogen) atom, and a carbon (C) atom or an oxygen (O) atom may be added instead. The type and amount of the element added to the upper layer Al may be set by arbitrarily varying the type and flow rate of the gas that is mixed with the well-known Ar gas in the sputtering method. For example, reactive sputtering, in which $O_2$ gas, $CO_2$ gas, or atmospheric gas is mixed with the Ar gas instead of $N_2$ gas, may be performed.

Furthermore, an Al alloy—N/Al alloy two-layer film using an alloy of Al mixed with yttrium (Y) or a rare earth metal element such as neodymium (Nd), gadolinium (Gd), or lanthanum (La) may be used instead of the Al film as the metallic thin film serving as a parent body. In this case, the margin for preventing the occurrence of hillocks during the heating process described above can be raised, and as a result, the yield and reliability of the product can be improved. The amount of Nd, Gd, La, or Y added to the Al is preferably no more than 5 wt %, and more preferably within a range of 0.1 to 5 wt %. When the amount is less than 0.1 wt %, it is difficult to obtain a sufficient hillock suppression effect, and when the amount exceeds 5 wt %, the specific resistance of the Al alloy itself rises (to 5 μΩcm or more), thereby diminishing the merits of low resistance.

Furthermore, in the first and second embodiments, an MoNb alloy obtained by adding no more than 10 wt %, for example 5 wt %, of Nb to Mo (molybdenum) is used as the second metallic thin film, but the present invention is not limited thereto. By adding an Nb atom, the corrosion resistance of the Mo, in particular the corrosion resistance thereof to pure water, can be improved. Moreover, rapid etching corrosion of an Al type metal in relation to a well-known solution containing phosphoric acid+nitric acid can be suppressed and controlled. Hence, in the first and second embodiments, the etching solution of the Al alloy film used as the first metallic thin film may also be employed as the etching liquid for the MoNb alloy. The amount of Nb to be added to the Mo to obtain this effect is preferably between 2.5 and 10 wt %. Alternatively, a similar effect can be obtained using an MoW film as the second metallic thin film, in which 30 to 50 wt % of W is added to the Mo.

Further, in the first and second embodiments, an ITO film containing a mixture of indium oxide ($In_2O_3$) and tin oxide ($SnO_2$) is used as the transparent conductive thin film, but the present invention is not limited thereto. A single body or a mixture of indium oxide, tin oxide, or zinc oxide (ZnO) may be used as the transparent conductive thin film. For example, when an IZO film containing a mixture of indium oxide and zinc oxide is used, the transparent conductive thin film can be deposited in an amorphous condition using a well-known sputtering method employing Ar gas, and a weak acid solution such as a oxalic acid may be used as an etching liquid instead of the strong acid solution containing hydrochloric acid+nitric acid employed in the examples described above. In this case, when films using an alloy containing Al, Mo, or another element having a low resistance to acid are used in the first and second metallic thin films, as in this embodiment, corrosion of the Al type and Mo type alloy films caused by penetration of the chemicals used during etching of the transparent conductive thin film, and resultant disconnection, can be prevented.

Moreover, when an ITZO film containing an appropriate mixture of indium oxide, tin oxide, and zinc oxide is used, the amorphously formed film can be set in a chemically stable crystalline condition through the application of heat, and as a result, a highly corrosion-resistant, highly reliable liquid crystal display apparatus can be manufactured at a favorable yield. Note that when the oxygen composition of the respective indium oxide, tin oxide, and zinc oxide sputtered films is smaller than the stoichiometric composition such that defects occur in characteristics such as the permeability value and specific resistance value, film deposition is preferably performed using a mixture of Ar gas and $O_2$ gas or $H_2O$ gas as the sputtering gas, rather than Ar gas alone.

Furthermore, in the first and second embodiments, the first and second interlayer insulating films are constituted by silicon nitride (SiNx) films formed using a CVD method, but the interlayer insulating films are not limited thereto. It goes without saying that a silicon oxide (SiOx) film or another organic resin film may be applied to one or both of the first and second interlayer insulating films. Particularly when a photosensitive organic resin film is used as the interlayer insulating film, the contact holes may be formed using a photolithography process. Accordingly, when this type of film is used as the second interlayer insulating film, the film thickness need not be made thinner than that of the first interlayer insulating film.

In each of the embodiments described above, the outer diameter dimension of the contact holes formed in the second interlayer insulating film 18, 32 is set to be larger than the outer diameter dimension of the contact holes formed in the first interlayer insulating film 14, 29 such that the contact holes have a stepped sectional form. However, the contact holes may be formed in a tapered form by inclining the wall surface of each contact hole.

Third Embodiment

Figure 31:
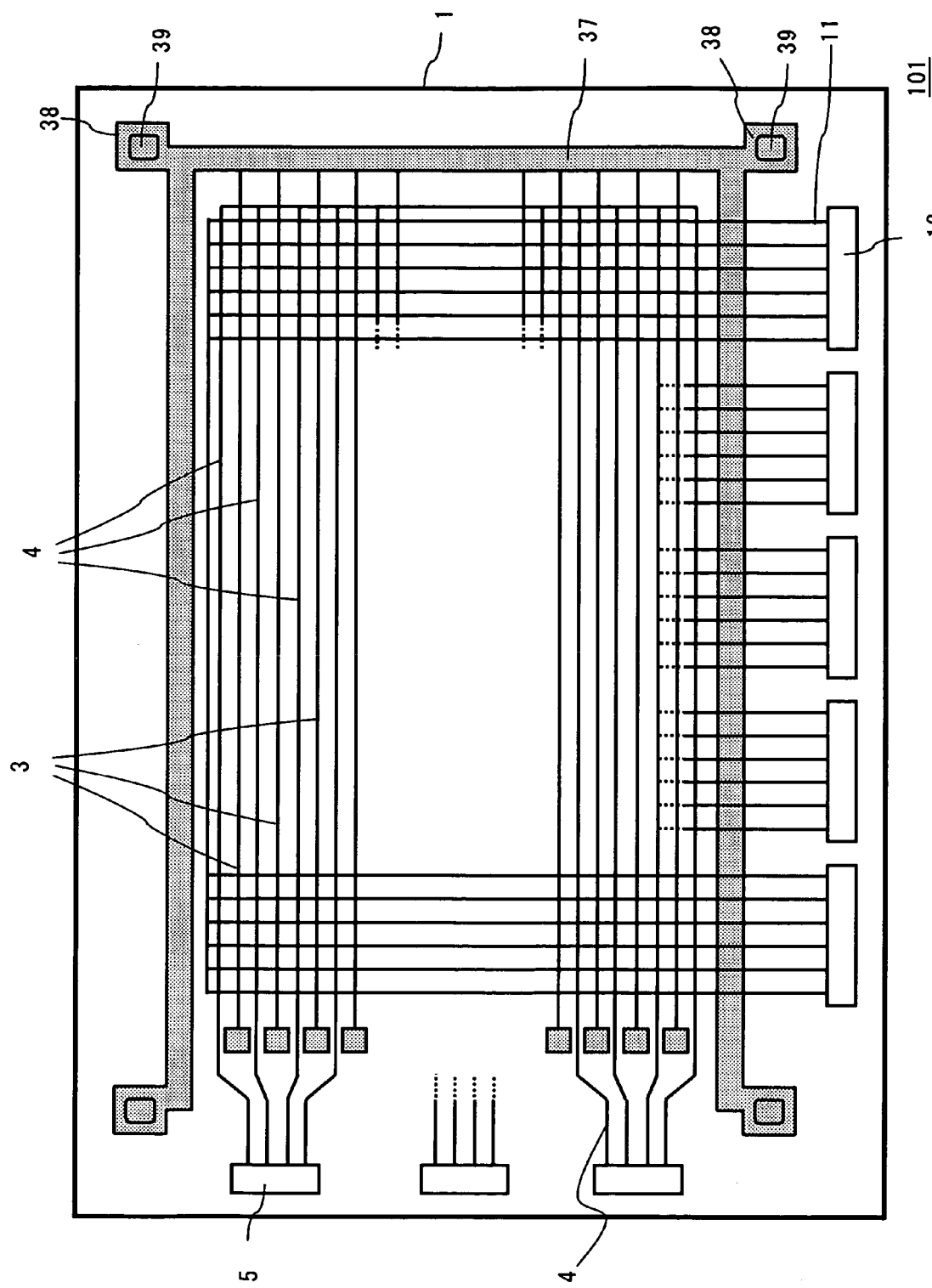
FIG. 31 is a plan view of a TFT array substrate for a liquid crystal display apparatus according to a third embodiment of the present invention.
Figure 32:
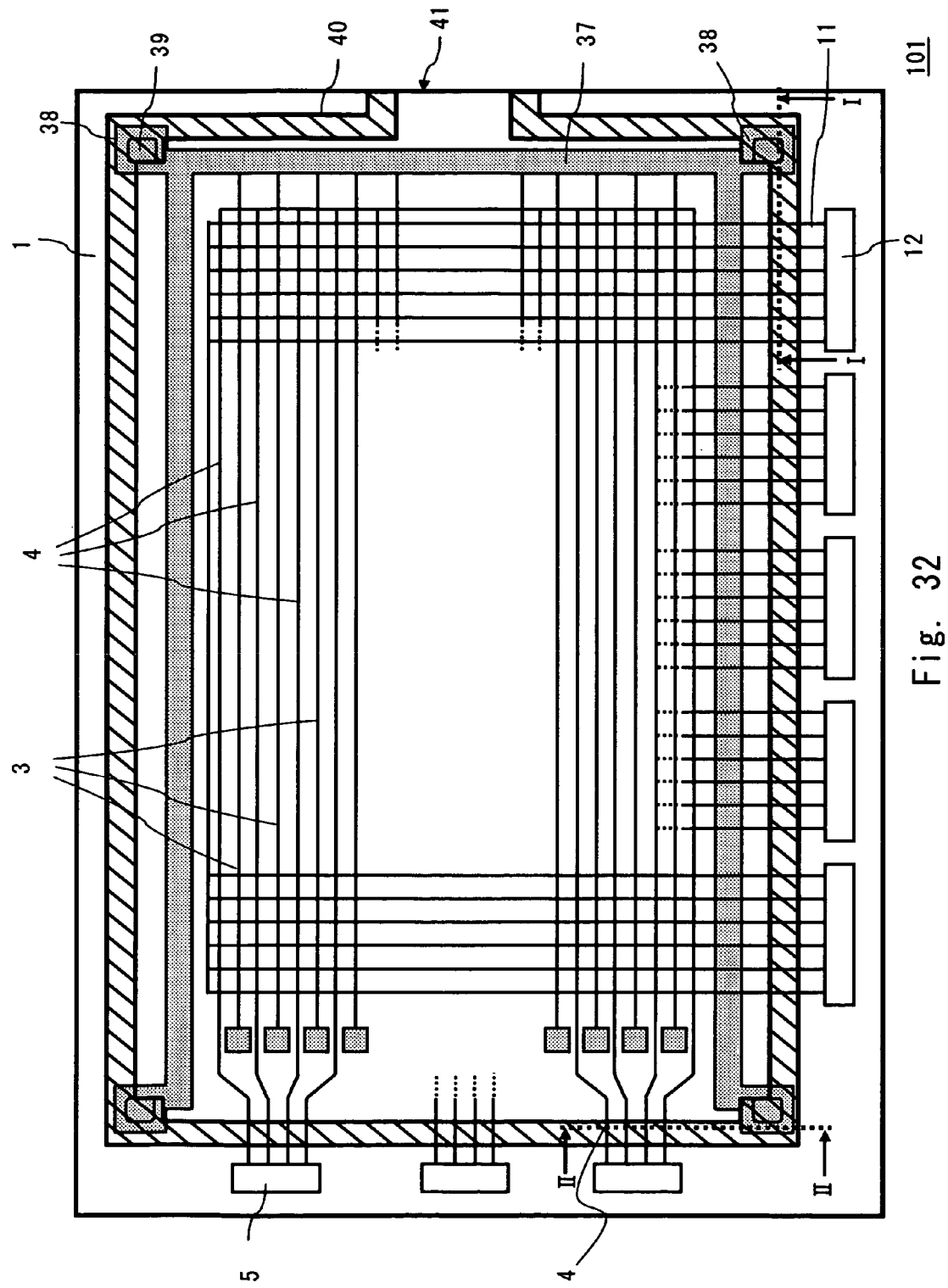
FIG. 32 is a plan view of the liquid crystal display panel for a liquid crystal display apparatus according to the third embodiment of the present invention.
Figure 33:
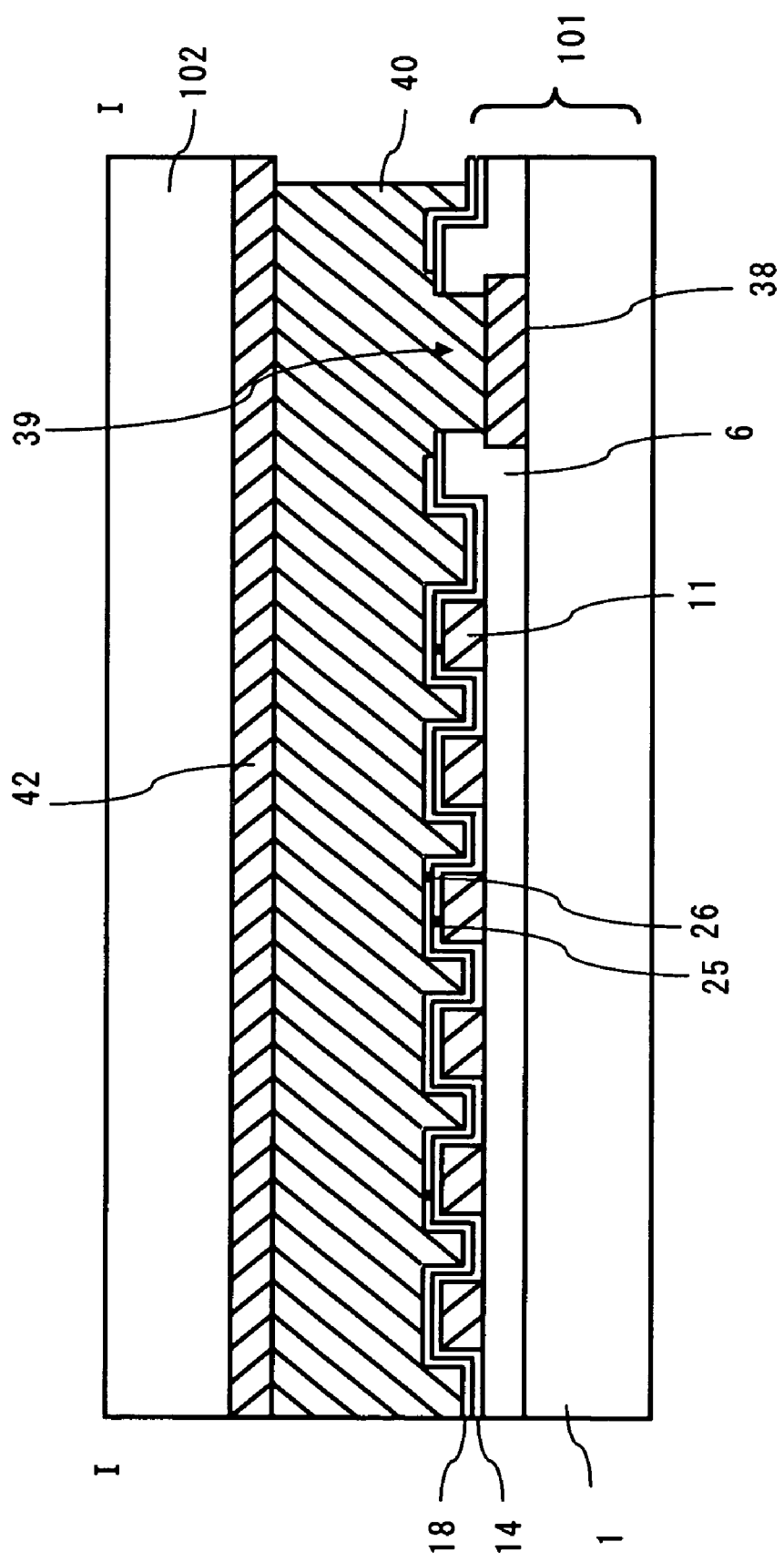
FIG. 33 is a sectional view of the liquid crystal display panel for a liquid crystal display apparatus according to the third embodiment of the present invention.
Figure 34:
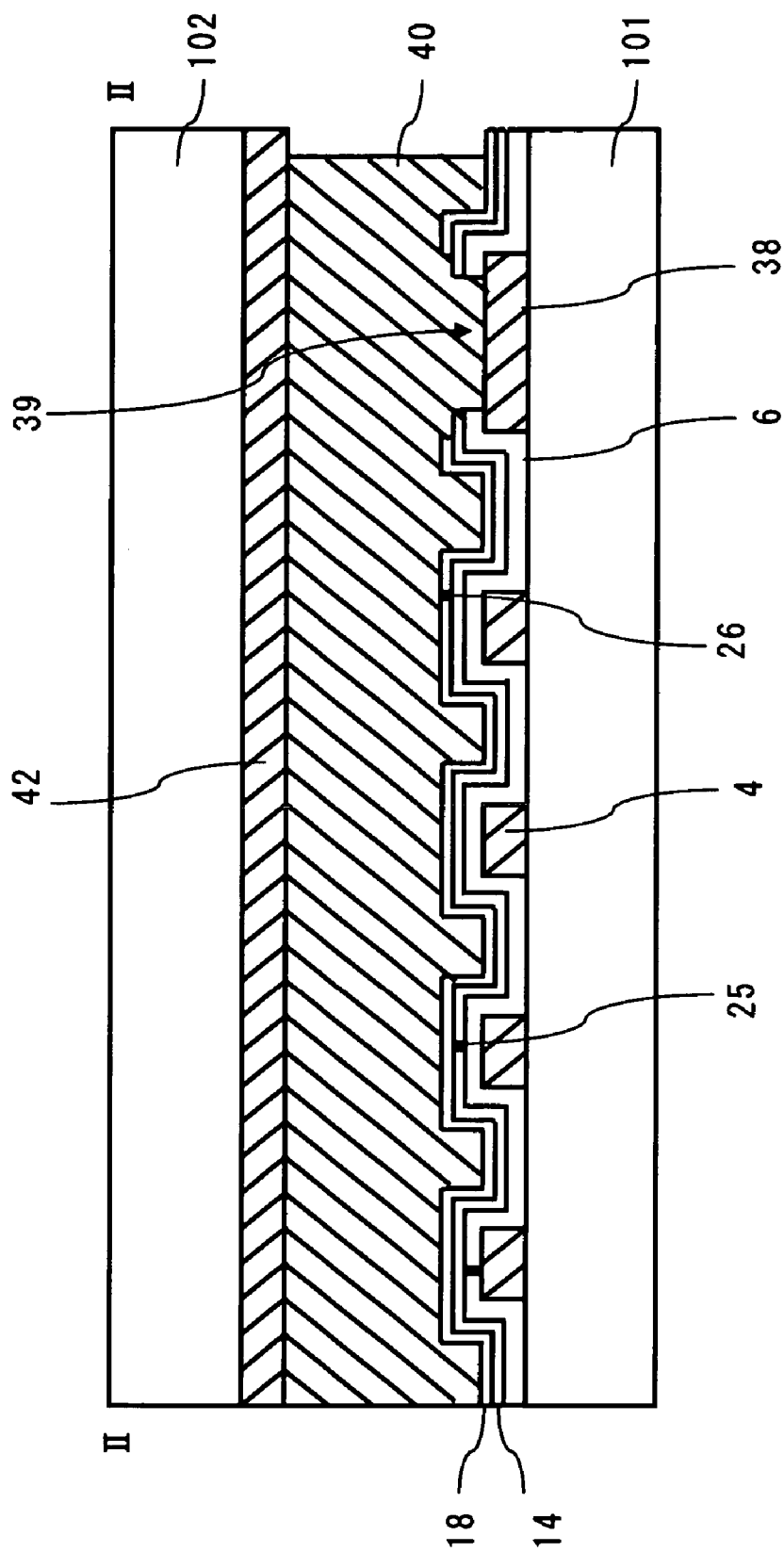
FIG. 34 is a sectional view of the liquid crystal display panel for a liquid crystal display apparatus according to the third embodiment of the present invention.

A liquid crystal panel for a liquid crystal display apparatus according to a third embodiment of the present invention will now be described with reference to FIGS. 31 to 34. FIG. 31 is a plan view of a TFT array substrate 101 used in a liquid crystal display panel according to this embodiment. FIG. 32 is a plan view showing the liquid crystal display panel which uses the TFT array substrate 101 shown in FIG. 31. FIG. 33 is a sectional view of I-I in FIG. 32. FIG. 34 is a sectional view of II-II in FIG. 32. Here, FIG. 31 shows the TFT array substrate 101 for the liquid crystal display apparatus created using the steps of the first embodiment, for example, and therefore identical elements to those of the first embodiment have been allocated identical reference numerals. Also, for ease of description, a color filter substrate 102 serving as a counter substrate opposing the TFT array substrate 101 has been omitted from FIG. 32.

As shown in FIGS. 33 and 34, the liquid crystal display panel for a liquid crystal display apparatus according to this embodiment comprises the TFT array substrate 101, the color filter substrate 102 disposed so as to face the TFT array substrate 101 and adhered to the TFT array substrate 101 via a sealing pattern 40, and liquid crystal sandwiched therebetween. The liquid crystal display panel according to this embodiment is constituted such that a common electrode pad 38 formed on the TFT array substrate 101 is electrically connected to a counter electrode 42 formed on the color filter substrate 102 by the conductive sealing pattern 40.

The TFT array substrate 101 according to this embodiment will now be described in detail with reference to FIG. 31. FIG. 31 is a view showing the TFT array substrate 101 for a liquid crystal display apparatus. A metallic film serving as a lowermost first conductive layer is formed by depositing at least one type of conductive thin film on the transparent insulating substrate 1, such as a glass substrate. Here, the storage capacitor common electrode 3, gate wiring 4, gate terminal 5, a common electrode wiring 37 and a common electrode pad 38 are formed by the first conductive layer. The common electrode wiring 37 and the common electrode pad 38 supplying a potential to a counter electrode are formed on a color filter substrate serving as a counter substrate, to be described below.

Further, the gate insulating film 6 (see FIGS. 2, 33, and 34) is formed to cover a part of the lowermost wiring, electrodes, and so on. A metallic film serving as the second conductive layer constituted by at least one type of conductive thin film is then formed on the gate insulating film 6. Here, the source wiring 11, which is orthogonal to the gate wiring 4 via the gate insulating film 6, and the source terminal portion 12 are formed by the second conductive layer. Pixel electrodes (not shown) are disposed in the region surrounded by the gate wiring 4 and source wiring 11. The plurality of pixel electrodes disposed in matrix form constitutes a display area.

The first interlayer insulating film 14 and second interlayer insulating film 18 (see FIGS. 2, 33, and 34) are formed on these electrodes as a two-layer second insulating film. A contact hole 39 is provided in the gate insulating film 6 and the interlayer insulating films 14, 18. The surface of the common electrode pad 38 is exposed through the contact hole 39.

The structures and manufacturing processes of the TFT portion and other wiring, electrodes, and so on correspond respectively to the structures and manufacturing processes described in the first embodiment, and are therefore not described in detail here.

The structure of the liquid crystal display panel for a liquid crystal display apparatus will now be described in further detail with reference to FIGS. 32, 33, and 34.

As shown in FIG. 32, in the liquid crystal display panel for a liquid crystal display apparatus according to this embodiment, the sealing pattern 40 formed by coating a sealing material is provided on the TFT array substrate 101 so as to overlap at least the common electrode pad 38 formed on the TFT array substrate 101. Further, the sealing pattern 40 is disposed so as to surround the display area constituted by the plurality of pixel electrodes. In other words, the common electrode wiring 37 and common electrode pad 38 are provided beneath the sealing pattern 40. Further, the sealing pattern 40 overlaps the second conductive layer via the two-layer interlayer insulating film constituted by the first interlayer insulating film 14 and second interlayer insulating film 18. By means of the sealing pattern 40, the color filter substrate 102 (see FIGS. 33 and 34), which is formed with at least a color filter (not shown) and the counter electrode 42, is adhered so as to face the TFT array substrate 101 at a fixed gap. Note that a color filter is not required for a monochrome display or the like.

Further, an opening portion not coated with the sealing material is formed in a central portion of one side of the sealing pattern 40. Here, the opening portion not coated with the sealing material is formed on a side facing the side at which the gate terminal 5, which is formed at one side of the transparent insulating substrate 1, is disposed. Further, the opening portion is formed in a region not including the common electrode pad 38. This opening portion serves as a liquid crystal injection port 41 for injecting liquid crystal (see FIG. 32).

The sealing material which forms the sealing pattern 40 functions as both an adhesive and an electrical conductor. By adhering the TFT array substrate 101 and the color filter substrate 102 to each other via the sealing pattern 40, the common electrode pad 38 in the contact hole portion 39 and the counter electrode 42 on the color filter substrate 102 are electrically connected (see FIGS. 33 and 34). As a result, an arbitrary common electrode potential input from the TFT array substrate 101 side during image display driving is supplied to the counter electrode 42 on the color filter side, and thus normal image display is performed. Note that the counter electrode 42 is made of a transparent conductive thin film constituted by a single body or a mixture of indium oxide ($In_2O_3$), tin oxide ($SnO_2$), or zinc oxide (ZnO)

A thermosetting epoxy resin material containing conductive microparticles may be used as the sealing material, for example. Finely ground particles of gold (Au), silver (Ag), copper (Cu), nickel (Ni), metallic particles having these metals as a main component, or a conductive paste containing these metals may be used as the conductive microparticles, for example. Alternatively, plastic beads capable of elastic deformation may be molded to an arbitrary size, the surface of the beads may be coated with the aforementioned metals using a method such as plating or vapor deposition, and the resulting particles may be used as the conductive microparticles. When the conductive particles contained in the sealing material are unevenly sized, and more specifically when large particles are contained therein, irregularities may occur in the gap between the two adhered substrates. Therefore, conductive microparticles formed by coating the surface of plastic beads that can be controlled to an arbitrary particle size are preferably used.

The sealing pattern 40 may be formed on the TFT array substrate 101 side or the color filter substrate 102 side. To ensure that the sealing pattern 40 overlaps the common electrode pad 38 portion, it is preferably formed on the TFT array substrate 101 side. The sealing pattern 40 may be formed using a printing method, for example. After forming the sealing pattern 40, the two substrates are caused to face each other and adhered by thermal compression bonding.

The liquid crystal injection port 41, in which the sealing material is not disposed, is formed between the adhered substrates, as described above. Liquid crystal (not shown) is injected through this portion between the two substrates. Then the liquid crystal injection port 41 is sealed by a sealing material (not shown). Thus, the liquid crystal display panel for a liquid crystal display apparatus according to the third embodiment of the present invention reaches completion.

As shown in FIG. 33, in this embodiment of the present invention, the sealing pattern 40 and the source wiring 11 of the second conductive layer overlap via the two-layer interlayer insulating film 14, 18. More specifically, in the source wiring 11 portion near the source terminal 12 portion on the TFT array substrate 101, the source wiring 11 is covered by the interlayer insulating film constituted by at least two layers, i.e. the first interlayer insulating film 14 and the second interlayer insulating film 18, and is thereby electrically insulated from the conductive sealing material. As a result, the possibility of an electrical short-circuit between the source wiring 11 and sealing material caused by film fracture portions or the pin holes 25, 26 in the interlayer insulating films 14 and 18 is reduced dramatically, enabling effective prevention of display defects.

Further, as shown in FIG. 34, the top of the gate wiring 4 near the gate terminal portion 5 on the TFT array substrate 101 is covered by the gate insulating film 6 serving as the first insulating film in addition to the two-layer interlayer insulating film. As a result, the possibility of an electrical short-circuits between the gate wiring 4 and sealing material is low. Furthermore, by providing an interlayer insulating film constituted by at least two layers, i.e. the first interlayer insulating film 14 and second interlayer insulating film 18 in this embodiment of the present invention, the margin for preventing electrical short-circuits can be increased.

Further, as shown in FIGS. 33 and 34, the outer diameter dimension of the contact holes formed in the second interlayer insulating film 18 is preferably set to be larger than the outer diameter dimension of the contact holes in the first interlayer insulating film 14 corresponding respectively thereto. In other words, the opening portion in the upper layer second interlayer insulating film 18 is set to be larger than the opening portion in the lower layer first interlayer insulating film 14 such that the contact holes in the second insulating film have a stepped or tapered sectional form. As a result, disconnection defects in the contact hole stepped portions of the sealing pattern 40 can be prevented.

Further, the film thickness of the second interlayer insulating film 18 is preferably set to be thinner than the film thickness of the first interlayer insulating film 14. In this case, similarly to the first embodiment, the time required for dry etching when forming the contact holes in the second interlayer insulating film 18 can be made shorter than the time required for dry etching of the first interlayer insulating film 14. Hence, even when pin hole defects caused by air bubbles or the like occur in the resist pattern, the pin holes in the interlayer insulating film do not completely penetrate the first and second interlayer insulating films 14, 18. As a result, electrical short-circuits can be prevented effectively.

A method of manufacturing the liquid crystal display panel for a liquid crystal display apparatus according to the third embodiment will now be described in detail with reference to FIGS. 2, 32, 33, and 34.

First, the TFT array substrate 101 is formed as described in the first embodiment. As described above, the various wiring, electrodes, and so on are laminated onto the transparent insulating substrate 1. More specifically, the gate electrode 2, storage capacitor common electrode 3, gate wiring 4, and gate terminal 5, which together constitute the first conductive layer, are formed on the transparent insulating substrate 1. The common electrode wiring 37 and common electrode pad 38 for supplying a potential to the counter electrode formed on the color filter substrate serving as a counter substrate, to be described below, are also formed by the first conductive layer. Next, the first insulating film (gate insulting film 6), semiconductor film (semiconductor active film 7), and ohmic contact film 8 are patterned. Next, the source electrode 9, drain electrode 10 (pixel drain), source wiring 11, and source terminal 12, which together constitute the second conductive layer, are formed.

Next, the first interlayer insulating film 14 is formed as the lower layer of the second insulating film. The second interlayer insulating film 18 is then formed as the upper layer of the second insulating film. The pixel electrode 22, gate terminal pad 23, and source terminal pad 24, which together constitute the third conductive layer, are then patterned, and thus the TFT array substrate 101 for a liquid crystal display apparatus reaches completion.

Next, the color filter substrate 102 is formed. Specifically, a color filter (not shown) comprising colored layers colored R, G, and B, respectively, and the counter electrode 42, which is constituted by a transparent conductive thin film made of ITO or the like, are laminated in succession onto a transparent conductive substrate made of glass or the like.

Next, the sealing material described above is applied so as to overlap the common electrode pad 38 formed on the TFT array substrate 101 and to surround the display area constituted by the plurality of pixel electrodes, thereby forming the sealing pattern 40. A part in which the sealing material is not provided is formed on one side of the sealing pattern 40 to form the liquid crystal injection port 41.

The TFT array substrate 101 formed with the sealing pattern 40 and the color filter substrate 102 are then caused to face each other and subjected to thermal compression bonding such that the two substrates are adhered to each other via the sealing pattern 40 with a fixed gap therebetween. As a result, the common electrode pad 38 in the contact hole portion 39 and the counter electrode 42 on the color filter substrate 102 are electrically connected via the sealing pattern 40. Liquid crystal is then injected through the liquid crystal injection port 41 into the space formed by the two substrates and the sealing pattern 40. Once the liquid crystal (not shown) has been injected into the gap between the two substrates, the liquid crystal injection port 41 is sealed by a sealing material (not shown), and thus the liquid crystal display panel for a liquid crystal display apparatus according to the third embodiment of the present invention can be manufactured.

In the liquid crystal panel comprising the TFT array substrate described above, the laminated structure constituted by at least two layers, i.e. the first interlayer insulating film 14 and second interlayer insulating film 18, electrically insulates the lower layer wiring and electrodes (the first conductive layer and second conductive layer) from the upper layer wiring and electrodes (the third conductive layer). Therefore, in comparison with an example in which only a single-layer interlayer insulating film is provided, electrical short-circuits between the lower layer and upper layer wiring and electrodes and display defects caused by such electrical short-circuits can be prevented effectively.

Further, in this embodiment of the present invention, in the source wiring 11 portion near the source terminal 12 portion on the TFT array substrate 101, the source wiring 11 is covered by the interlayer insulating film constituted by at least two layers, i.e. the first interlayer insulating film 14 and the second interlayer insulating film 18, as described above. Therefore, even when film fracture portions or the pin holes 25, 26 occur in the interlayer insulating films 14 and 18, short-circuits between the source wiring 11 and sealing material caused thereby can be effectively suppressed, enabling prevention of display defects. Moreover, the top of the gate wiring 4 near the gate terminal portion 5 on the TFT array substrate 101 is covered by the gate insulating film 6 in addition to the two-layer interlayer insulating film, and therefore the margin for preventing electrical short-circuits can be increased.

Figure 35:
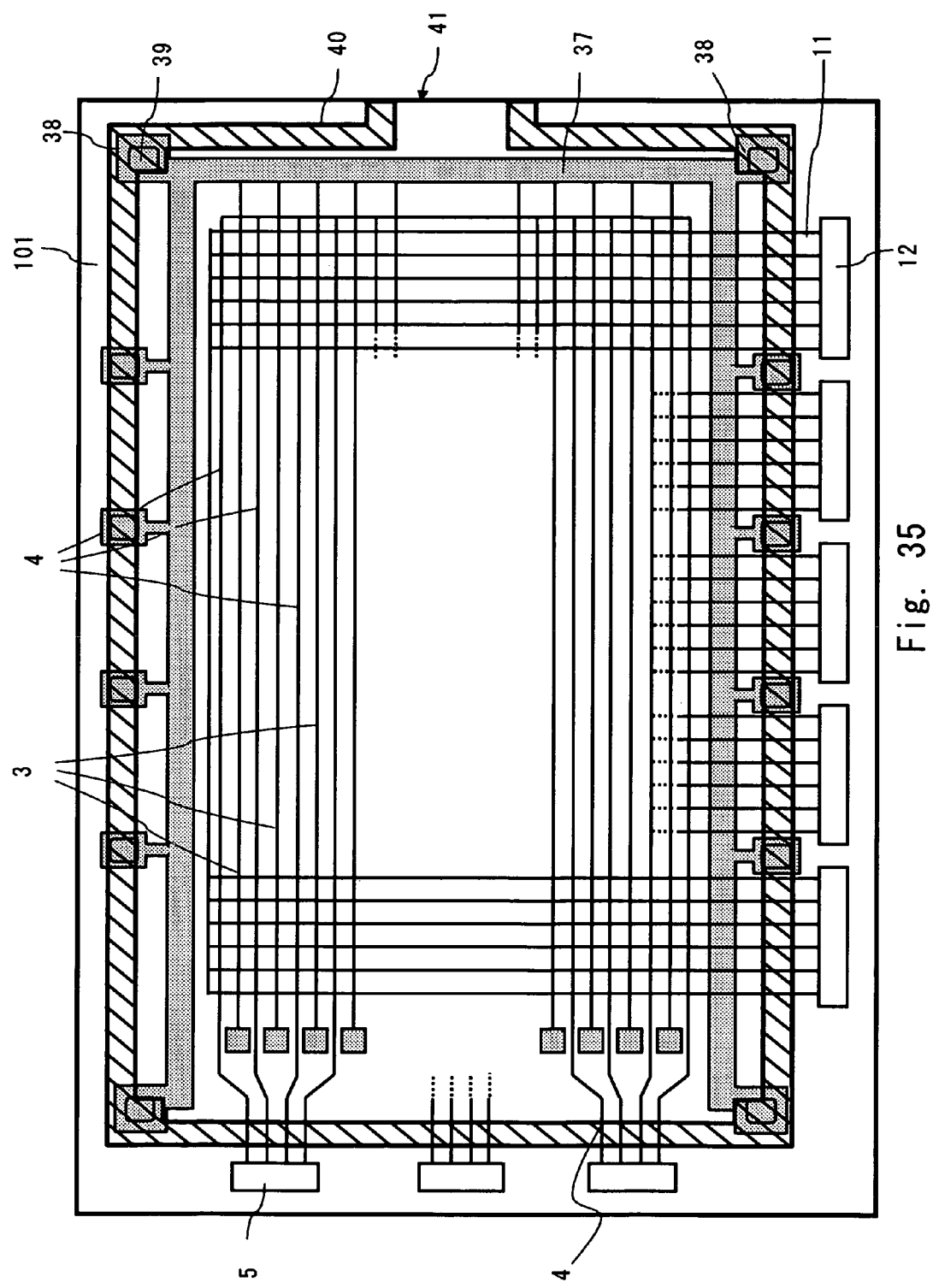
FIG. 35 is a sectional view of the liquid crystal display panel for a liquid crystal display apparatus according to the third embodiment of the present invention.

Note that in this embodiment, the common electrode pad 38 and contact hole 39 are formed in the four corners of the display area of the TFT array substrate 101, but the present invention is not limited thereto. For example, as shown in FIG. 35, the common electrode pad 38 and contact hole 39 may be formed in corresponding pluralities in arbitrary positions on the common electrode wiring 37 surrounding the display area. In this case, electrical connections can be made between the common electrode pads 38, conductive sealing pattern 40, and counter electrodes 42 through a larger number of the contact holes 39, and hence the overall connection electric resistance can be reduced.

Further, if an electrical connection failure occurs in a part of the contact holes 39, this failure can be compensated for by the electrical connections of the remaining plurality of contact holes 39, and hence display defects caused by defects in the electrical connections to the counter electrodes can be prevented effectively. As a result, display defects caused by defects in the electrical connections to the counter electrodes can be prevented effectively. Furthermore, the need to provide a pattern for the common electrode pads 38 is eliminated, and the contact holes 39 can be formed as desired directly on the common electrode wiring 37 to create an electrical connection with the sealing pattern 40.

Note that in the embodiment described above, an active matrix type liquid crystal display apparatus was described as an example of a display apparatus, but the present invention is not limited to an active matrix type liquid crystal display apparatus, and may be applied to any display apparatus in which a display material such as liquid crystal, particles, or liquid is provided between an array substrate and a counter substrate. Accordingly, the present invention may be applied to electronic paper and the like having a cell constitution in which a display material is sandwiched between a pair of substrates.

What is claimed is:

1. A display apparatus comprising:
   a TFT array substrate on which TFTs are formed in an array;
   a counter substrate disposed so as to face the TFT array substrate; and
   a sealing pattern for adhering the TFT array substrate and the counter substrate to each other,
   wherein the counter substrate comprises a counter electrode,
   the TFT array substrate comprises:
   a first conductive layer;
   a first insulating film formed on the first conductive layer;
   a second conductive layer disposed so as to intersect the first conductive layer via the first insulating film;
   a second insulating film formed on the second conductive layer and having at least two layers; and
   common electrode wiring provided below the sealing pattern and electrically connected to the counter electrode by the sealing pattern, wherein
   the sealing pattern overlaps the second conductive layer via the second insulating film, and the sealing pattern overlaps the common electrode wiring in an overlapping region when viewed in a vertical direction, and the common electrode wiring and the sealing pattern are electrically connected to each other via a contact hole arranged at the overlapping region, the contact hole formed in the first insulating film.

2. The display apparatus according to claim 1, wherein the TFT array substrate further comprises a third conductive layer provided on the second insulating film, and
   the second insulating film between the second conductive layer and the third conductive layer is formed from at least two layers.

3. The display apparatus according to claim 1, wherein, in a contact hole formed in the second insulating film, an opening portion of an upper layer of the at least two-layer second insulating film is formed to be larger than an opening portion of a lower layer such that a sectional form of the second insulating film is stepped.

4. The display apparatus according to claim 2, wherein, in a contact hole formed in the second insulating film, an opening portion of an upper layer of the at least two-layer second insulating film is formed to be larger than an opening portion of a lower layer such that a sectional form of the second insulating film is stepped.

5. The display apparatus according to claim 1, wherein a layer thickness of the upper layer of the second insulating film formed from at least two layers is thinner than a layer thickness of the lower layer.

6. The display apparatus according to claim 2, wherein a layer thickness of the upper layer of the second insulating film formed from at least two layers is thinner than a layer thickness of the lower layer.

7. The display apparatus according to claim 3, wherein a layer thickness of the upper layer of the second insulating film formed from at least two layers is thinner than a layer thickness of the lower layer.

8. The display apparatus according to claim 1, wherein the second conductive layer is a source wiring which connects to the TFTs.

9. The display apparatus according to claim 1, wherein the common electrode wiring other than the overlapping region is located inside an area surrounded by the sealing pattern when viewed in a vertical direction.

10. The display apparatus according to claim 1, wherein a common electrode pad is arranged at the contact hole, the contact hole located at a corner of the sealing pattern.

11. The display apparatus according to claim 1, wherein a common electrode pad is arranged at the contact hole, the contact hole at the sealing pattern.

* * * * *